US006858875B2

(12) United States Patent
Hamano et al.

(10) Patent No.: US 6,858,875 B2
(45) Date of Patent: Feb. 22, 2005

(54) LIGHT-EMITTING-ELEMENT ARRAY

(75) Inventors: Hiroshi Hamano, Hachioji (JP);
Masumi Taninaka, Hachioji (JP);
Masaharu Nobori, Hachioji (JP);
Masumi Koizumi, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 10/630,936

(22) Filed: Jul. 31, 2003

(65) Prior Publication Data

US 2004/0021145 A1 Feb. 5, 2004

(30) Foreign Application Priority Data

Aug. 2, 2002 (JP) ........................................ 2002-225880

(51) Int. Cl.[7] .......................... H01L 33/00; H01L 21/00
(52) U.S. Cl. ........................ 257/88; 257/91; 257/92; 257/93; 257/99; 438/22; 438/24; 438/28
(58) Field of Search ........................ 257/88, 91–93, 257/99; 438/22, 24, 28; 347/237, 238

(56) References Cited

U.S. PATENT DOCUMENTS

| 5,449,926 A | * | 9/1995 | Holm et al. ................... 257/88 |
| 6,191,438 B1 | * | 2/2001 | Ikehara et al. ................. 257/99 |
| 6,211,537 B1 | * | 4/2001 | Shimizu et al. ................ 257/88 |
| 6,433,367 B1 | * | 8/2002 | Tohyama et al. .............. 257/88 |
| 6,765,235 B2 | * | 7/2004 | Fujiwara et al. ............... 257/88 |
| 2004/0021146 A1 | * | 2/2004 | Fujiwara et al. ............... 257/93 |

OTHER PUBLICATIONS

"LED Purinta no Sekkei" (LED Printer Design), pp. 60–63, Trikeppusu KK, Aug. 31, 1987.

* cited by examiner

*Primary Examiner*—Donghee Kang
(74) *Attorney, Agent, or Firm*—Rabin & Berdo, P.C.

(57) ABSTRACT

A light-emitting-element array has a semiconductor layer formed on a current-blocking layer. Light-emitting elements are formed in the semiconductor layer by diffusion of an impurity of a different conductive type. An isolation trench divides the semiconductor layer into a first region and a remaining region, and divides the array of light-emitting elements into segments disposed alternately in these two regions, each segment preferably including one or two light-emitting elements. A first shared interconnecting pad is electrically coupled to the light-emitting elements in the first region by electrical paths not crossing the isolation trench. A second shared interconnecting pad is electrically coupled to light-emitting elements in the remaining semiconductor region by electrical paths crossing the isolation trench. The array can then be driven by a number of separate interconnecting pads equal to half the number of the light-emitting elements.

17 Claims, 17 Drawing Sheets

(a)

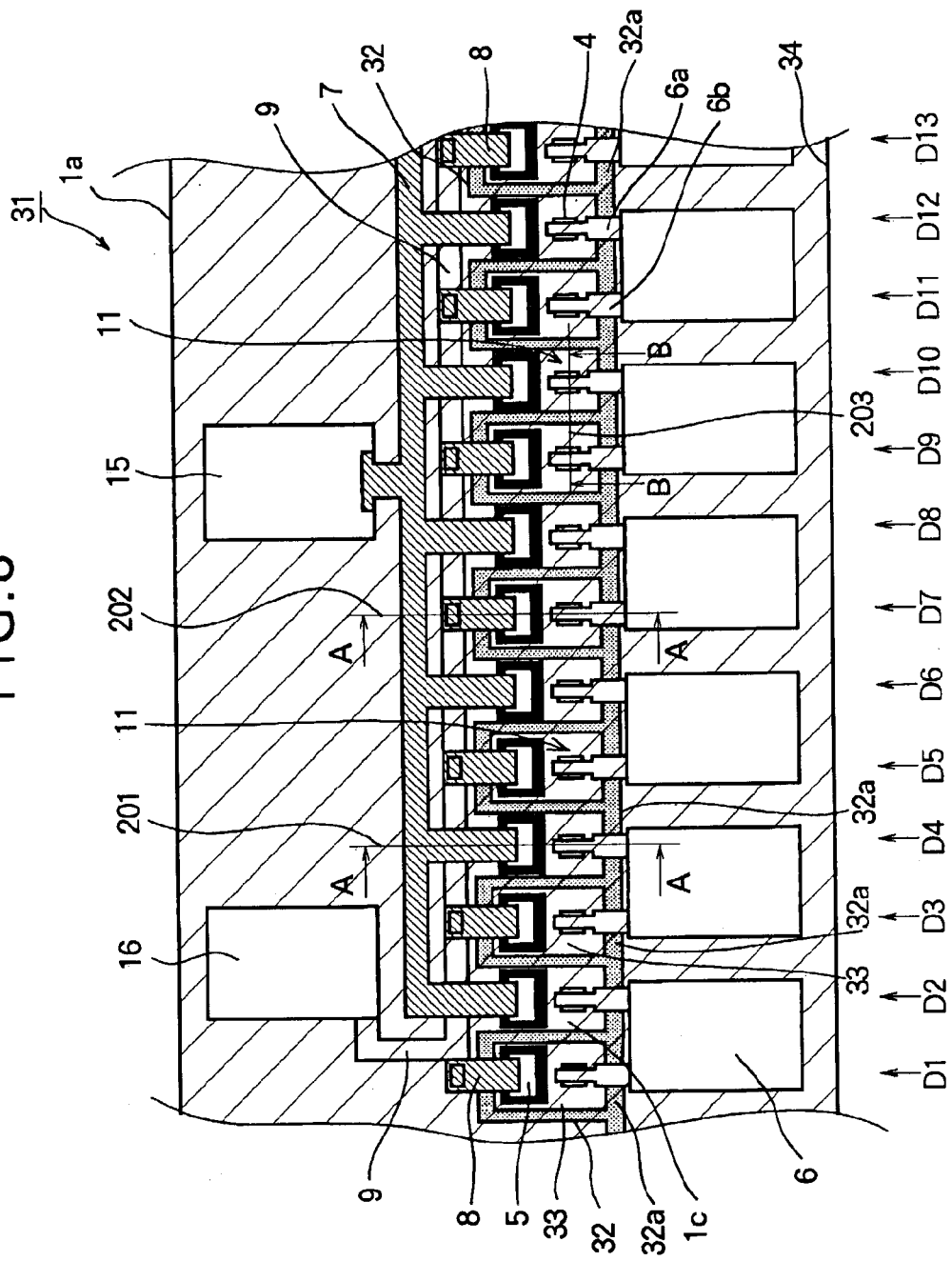

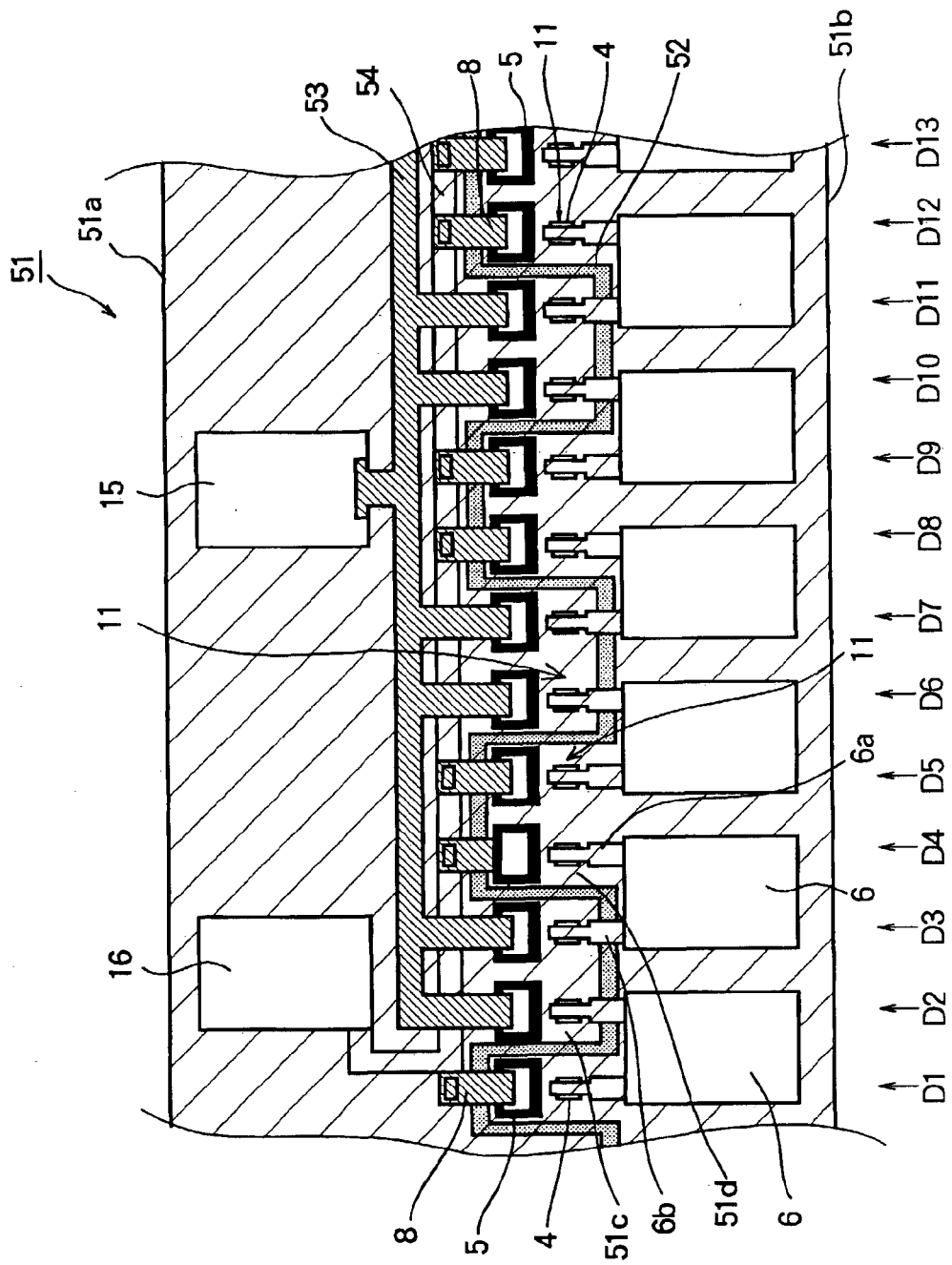

LIGHT-EMITTING-ELEMENT ARRAY

BACKGROUND OF THE INVENTION

1. Field of the Invention

The present invention relates to a light-emitting-element array, more particularly to its wire-bonding interconnection pads and their interconnections to the light-emitting elements.

2. Description of the Related Art

The type of light-emitting-element array with which the present invention is concerned has a plurality of light-emitting elements spaced at equal intervals. A light-emitting-element array using light-emitting diodes (LEDs) as its light-emitting elements is referred to as an LED array. Conventional LED arrays have, for example, the structure shown in FIGS. 18 and 19, which are taken from page 60 of 'LED Purinta no Sekkei' (Design of LED Printers), published by Triceps.

FIG. 18 is a sectional view of the relevant parts of an LED array 100, and FIG. 19 is a plan view. The LED array 100 comprises an n-type gallium arsenide phosphide (GaAsP) layer 101 formed on an n-type gallium arsenide (GaAs) substrate 105. A p-type impurity such as zinc (Zn) is selectively diffused into the GaAsP layer 101 to form a row of p-type regions 106 that function as light-emitting elements. The GaAsP layer 101 is covered by a dielectric film 102 with openings through which the tips of aluminum electrodes 103 make individual contact with the p-type regions 106.

In order to form an electrical connection with a driver circuit (not shown), each of the other ends of the aluminum electrodes 103 is electrically coupled to an electrode pad 107 formed to present a flat surface with an adequate area for wire bonding. A gold-germanium-nickel (AuGeNi) electrode 104 is formed under the n-type GaAs substrate 105 as a common electrode, electrically coupled to the p-type regions 106 through the n-type GaAs substrate 105 and GaAsP layer 101.

In many conventional LED arrays, each light-emitting element has a separate electrode pad 107, as shown. A dense array of light-emitting elements therefore has a correspondingly dense set of electrode pads, but the density of the electrode pads makes wire bonding difficult, leading to a rise in manufacturing cost.

The necessary number of electrode pads can be reduced by a matrix driving scheme, but known matrix driving schemes also lead to low manufacturing yields and correspondingly high manufacturing costs. The low yields are due to interconnection faults such as short circuits and open circuits that may occur where interconnecting lines cross one another, or cross isolation trenches.

SUMMARY OF THE INVENTION

An object of the present invention is to reduce the number of wire-bonding interconnections needed to drive a light-emitting-element array.

Another object of the invention is to improve manufacturing yields by reducing the occurrence of interconnection faults in a light-emitting-element array.

A further object is to enable a light-emitting-element array to be driven by an inexpensive driving circuit.

The present invention provides a light-emitting-element array having a semiconductor layer of a first conductive type formed on a current-blocking layer. The semiconductor layer is divided by an isolation trench into a first semiconductor region and a remaining semiconductor region, electrically isolated from the first semiconductor region.

A plurality of light-emitting elements are formed by diffusion of an impurity of a second conductive type into the surface of the semiconductor layer. The light-emitting elements are disposed in, for example, a linear array or a staggered array. The isolation trench divides the array into segments including at least one light-emitting element each, the segments being disposed alternately in the first semiconductor region and the remaining semiconductor region. The segments preferably include either just one light-emitting element each, or just two light-emitting elements each.

The light-emitting-element array also includes first and second shared interconnecting pads. The first shared interconnecting pad is electrically coupled to the light-emitting elements in the first semiconductor region by electrical paths not crossing the isolation trench. The second shared interconnecting pad is electrically coupled to the light-emitting elements in the remaining semiconductor region by electrical paths crossing the isolation trench.

The light-emitting-element array may also include a number of separate interconnecting pads equal to half the total number of light-emitting elements, each separate interconnecting pad being electrically coupled to a mutually adjacent pair of light-emitting elements belonging to different segments of the array. The separate interconnecting pads may be disposed in the remaining semiconductor region, in which case the first and second shared interconnecting pads are preferably disposed in the first semiconductor region.

In this light-emitting-element array, the necessary number of wire-bonding interconnections is reduced because each separate interconnecting pad drives two light-emitting elements.

The isolation trench may have a square-wave configuration weaving through the linear array of light-emitting elements. Alternatively, the isolation trench may surround each array segment disposed in the remaining semiconductor region, thereby dividing the remaining semiconductor region into mutually isolated subregions.

Compared with conventional matrix-driving schemes, the present invention reduces the number of points at which interconnecting leads and lines must cross one another. The square-wave trench configuration in particular also reduces the number of points at which interconnecting leads and lines cross the isolation trench. The probability of occurrence of interconnection faults is therefore reduced, and manufacturing yields are improved.

The semiconductor layer in the light-emitting array may include an n-type $Al_yGa_{1-y}As$ light-emitting layer, an underlying n-type $Al_xGa_{1-x}As$ layer, an overlying n-type $Al_zGa_{1-z}As$ layer, and an n-type GaAs contact cap layer. The bottom diffusion fronts of the light-emitting elements are disposed in the n-type $Al_yGa_{1-y}As$ layer. Parts of the n-type GaAs contact cap layer including the lateral diffusion fronts of the light-emitting elements are removed to eliminate pn junctions from regions having a lower aluminum content than the n-type $Al_yGa_{1-y}As$ light-emitting layer. This structure improves the light-emitting efficiency of the array, permitting it to be driven by an inexpensive driving circuit.

The present invention also provides an optical printing head including at least one light-emitting-element array of the invented type, and an electrophotographic printer including at least one such optical printing head.

BRIEF DESCRIPTION OF THE DRAWINGS

In the attached drawings:

FIG. 8 is a plan view of part of an LED array illustrating a second embodiment of the invention;

FIG. 11 is a plan view of part of an LED array illustrating a fourth embodiment of the invention;

DETAILED DESCRIPTION OF THE INVENTION

Figure 1:
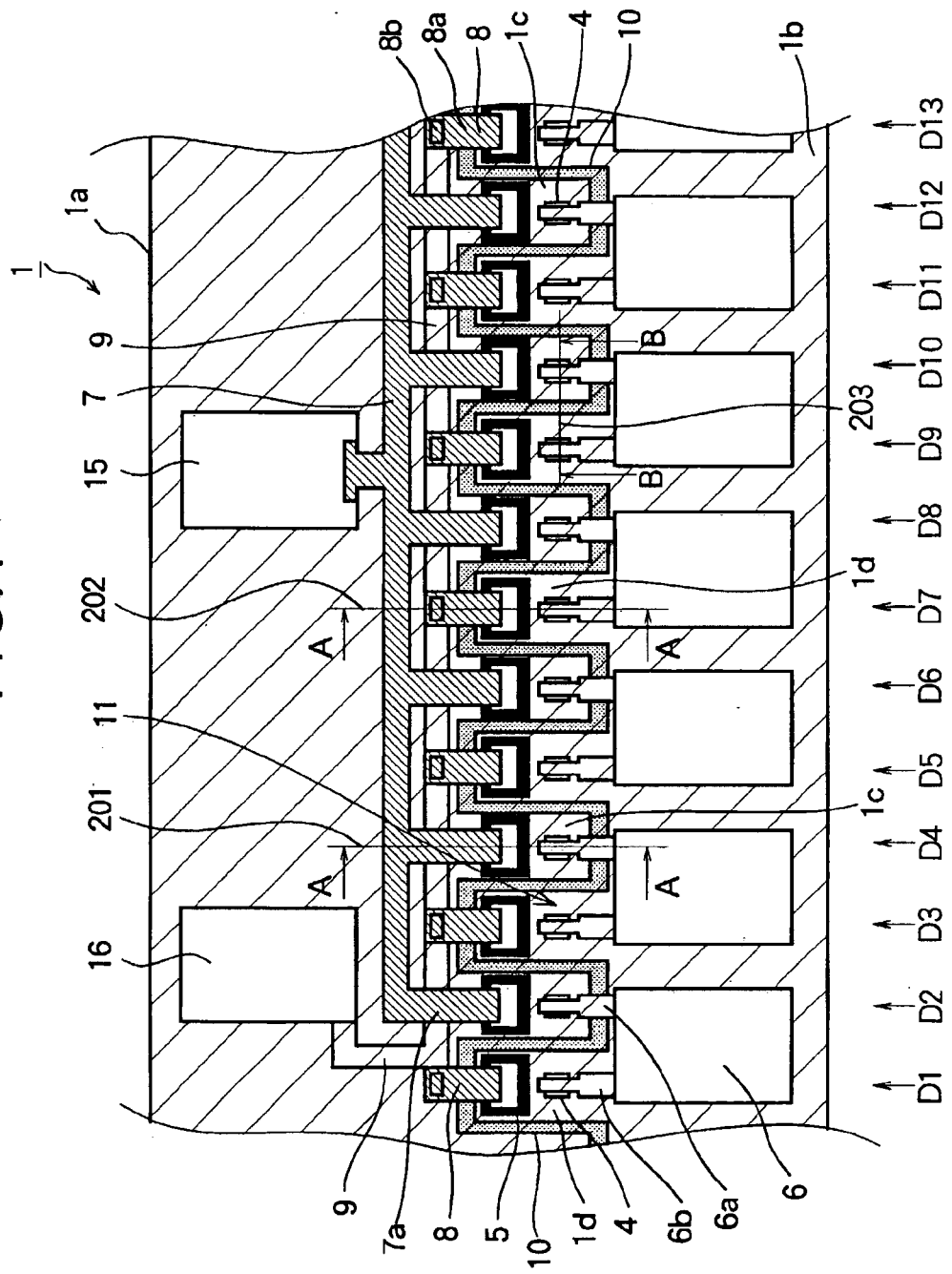
FIG. 1 is a plan view of part of an LED array illustrating a first embodiment of the invention.

Embodiments of the invention will now be described with reference to the attached drawings, in which like elements are indicated by like reference characters.

First Embodiment

Figure 2A:
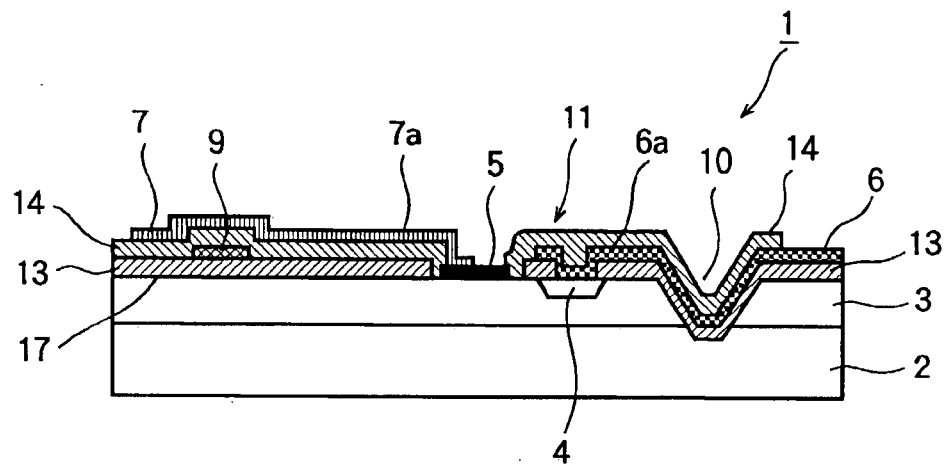
FIG. 2A is a sectional view through index line 201 in FIG. 1, as seen from the direction of arrows A.
Figure 2B:
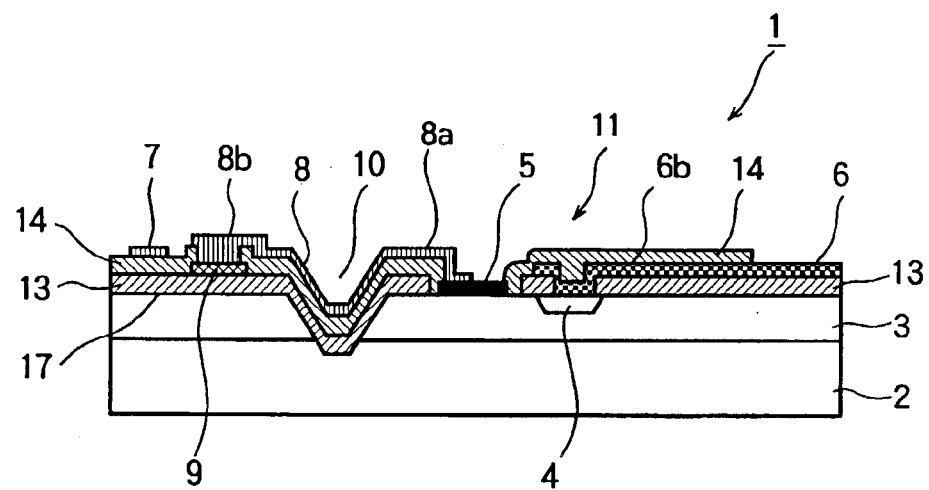
FIG. 2B is a sectional view through index line 202 in FIG. 1, as seen from the direction of arrows A.
Figure 2C:
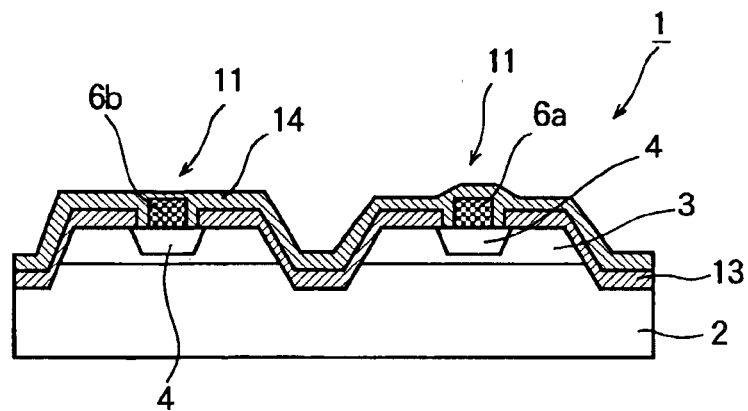
FIG. 2C is a sectional view through index line 203 in FIG. 1, as seen from the direction of arrows B.

An LED array 1 according to a first embodiment of the invention is illustrated in plan view in FIG. 1. FIGS. 2A, 2B, and 2C show sectional views through index lines 201, 202, and 203, respectively, in FIG. 1, seen from the direction of arrows A and B.

As shown in the sectional views, the LED array 1 comprises a high-resistance substrate 2 such as a semi-insulating GaAs substrate, on which is formed an n-type semiconductor layer 3 (n-type corresponding to the first conductive type). A pair of dielectric films 13 and 14 are formed on the semiconductor layer 3. As shown in FIG. 1, an isolation trench 10 is formed in a square-wave pattern running in the longitudinal direction of the array, dividing the array 1 (more specifically, the n-type semiconductor layer 3) into two semiconductor blocks 1a, 1b with interlocking comb-tooth-like projections 1c, 1d.

In this embodiment, semiconductor block 1a constitutes the first semiconductor region and semiconductor block 1b constitutes the remaining semiconductor region.

A row of p-type semiconductor diffusion regions 4 (p-type corresponding to the second conductive type) are formed in respective comb-tooth-like projections 1c and 1d by diffusion of a p-type impurity such as zinc. The p-type semiconductor diffusion regions 4 are formed at locations in or near semiconductor block 1b, and are aligned in the longitudinal direction of the array. In addition, n-electrodes 5 are formed in respective comb-tooth-like projections 1c and 1d at locations in or near semiconductor block 1a, also aligned in the longitudinal direction of the array. The n-electrodes 5 are disposed in openings in the dielectric films 13, 14. A row of anode interconnecting pads 6 (separate interconnecting pads) is disposed on the first dielectric film 13, aligned in the longitudinal direction of the array in semiconductor block 1b.

In the comb-tooth-like projections 1c of semiconductor block 1a, first leads 6a of anode interconnecting pads 6 contact the p-type semiconductor diffusion regions 4 through openings in the first dielectric film 13, as shown in the sectional view in FIG. 2A, and branch leads 7a of an upper shared interconnecting line 7 contact the n-electrodes 5 through openings in the second dielectric film 14.

In the comb-tooth-like projections 1d of semiconductor block 1b in FIG. 1, second leads 6b of the anode interconnecting pads 6 contact the p-type semiconductor diffusion regions 4 through openings in the first dielectric film 13, as shown in the sectional view in FIG. 2B, and the ends 8a of interconnecting leads 8 contact the n-electrodes 5 through openings in both dielectric films 13, 14.

The interconnecting leads 8 are formed on the second dielectric film 14. The other ends 8b of the interconnecting leads 8 contact a lower shared interconnecting line 9, formed on the first dielectric film 13, through further openings in the second dielectric film 14. The upper shared interconnecting line 7 is electrically coupled to a first cathode interconnecting pad 15, shown in FIG. 1. The lower shared interconnecting line 9 is electrically coupled to a second cathode interconnecting pad 16. The cathode interconnecting pads 15, 16 are disposed on the first dielectric film 13 in semiconductor block 1a.

The pn junction formed between each p-type semiconductor diffusion region 4 and the n-type semiconductor layer 3 functions as a light-emitting element 11. The light-emitting elements 11 are disposed in a linear array. The first cathode interconnecting pad 15 functions as the first shared interconnecting pad; the second cathode interconnecting pad 16 functions as the second shared interconnecting pad. The interconnecting leads 8 and the lower shared interconnecting line 9 form electrical paths that cross the isolation trench 10; the upper shared interconnecting line 7 and its branch leads 7a form electrical paths that do not cross the isolation trench 10.

The invention is not restricted to a linear array of light-emitting elements 11. For example, the light-emitting elements 11 may be disposed in a staggered array, as will be illustrated in FIG. 17.

Next, a method of fabricating the LED array 1 will be described with reference to FIGS. 3A and 3B, 4A to 4C, 5A to 5C, 6, and 7.

Figure 3A:
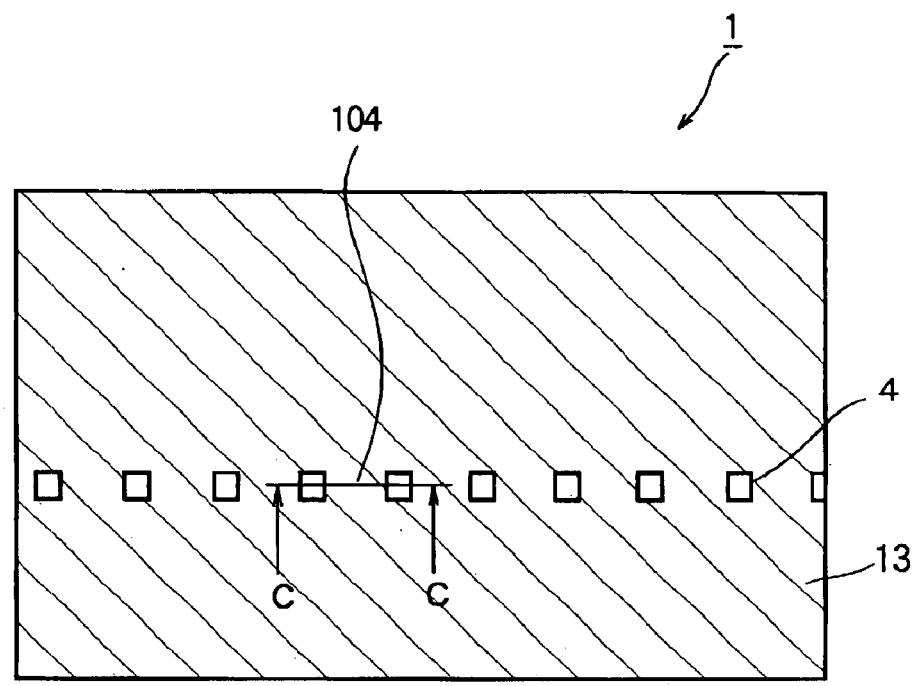
FIG. 3A is a plan view illustrating a step in the fabrication of the LED array in FIG. 1.
Figure 3B:
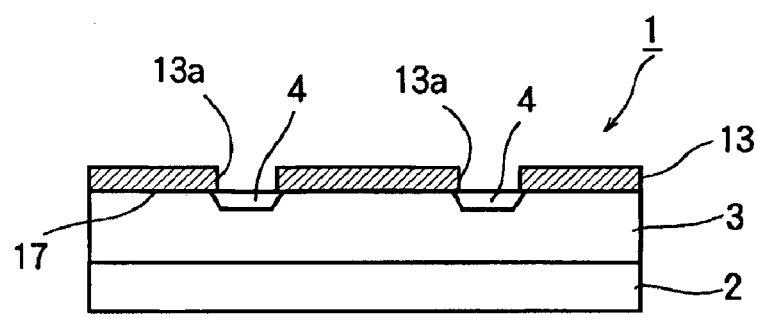
FIG. 3B is a sectional view through index line 104 in FIG. 3A, as seen from the direction of arrows C.

FIGS. 3A and 3B show the stage at which the row of p-type semiconductor diffusion regions 4 have been formed at predetermined locations in the longitudinal direction of the LED array 1. FIG. 3A is a plan view, and FIG. 3B is a sectional view through index line 104 in FIG. 3A, as seen from the direction of the arrows marked C. First, the process steps preceding the formation of the p-type semiconductor diffusion regions 4 will be briefly described.

As shown in FIG. 3B, a high-resistance substrate 2, such as a semi-insulating GaAs substrate, on which an n-type semiconductor layer 3 has been epitaxially grown is employed as the substrate of the LED array 1. An n-type aluminum-gallium arsenide (AlGaAs) layer can be used as the n-type semiconductor layer. To obtain good electrode contact, an n-type GaAs contact cap layer 17 is formed at the top of the n-type semiconductor layer 3.

Next, the first dielectric film 13, which is five hundred to three thousand angstroms (500 Å to 3000 Å) thick and also serves as a diffusion mask, is formed on the LED array substrate by sputtering, and openings 13a are formed at locations corresponding to the light-emitting elements by photolithography and etching. Then zinc, which is a p-type impurity, is diffused into the n-type semiconductor layer 3 through the openings 13a by a solid-phase diffusion process, for example, thereby forming the p-type semiconductor diffusion regions 4.

Figure 4A:
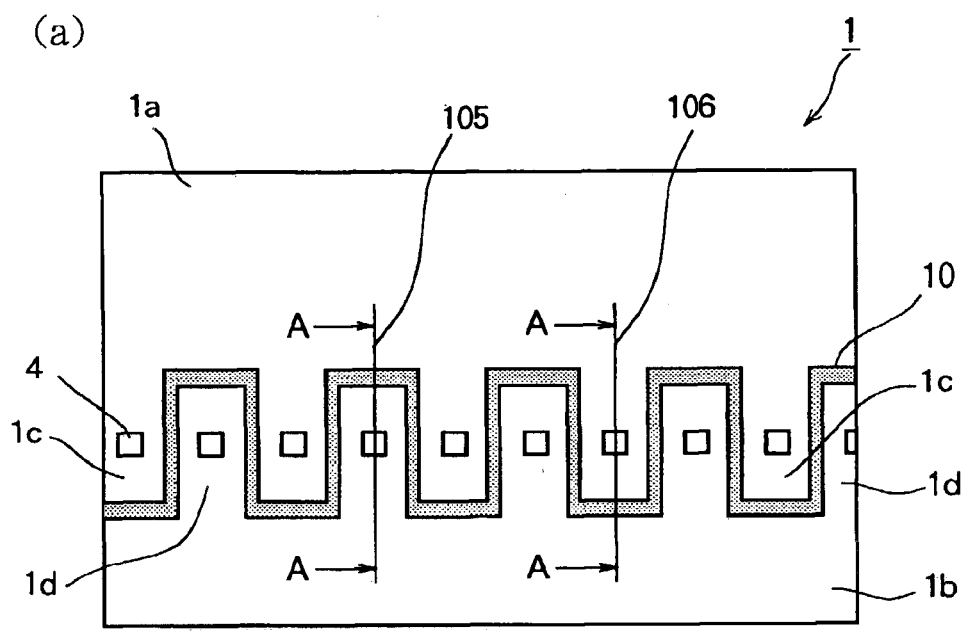
FIG. 4A is a plan view illustrating a step in the fabrication of the LED array in FIG. 1.
Figure 4B:
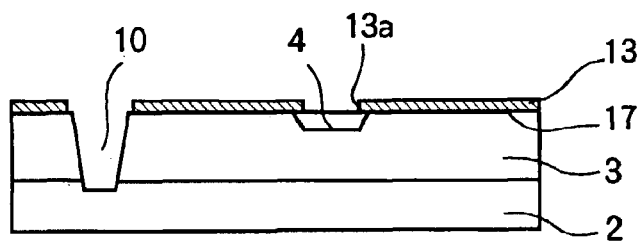
FIG. 4B is a sectional view through index line 105 in FIG. 4A, as seen from the direction of arrows A.
Figure 4C:
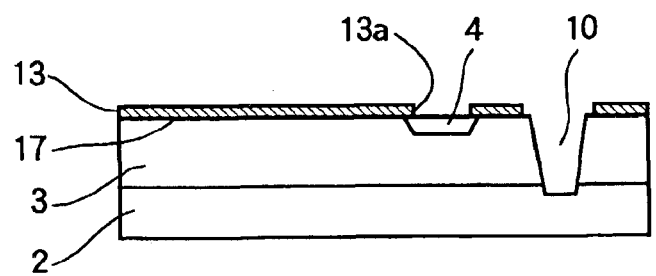
FIG. 4C is a sectional view through index line 106 in FIG. 4A, as seen from the direction of arrows A.
Figure 5A:
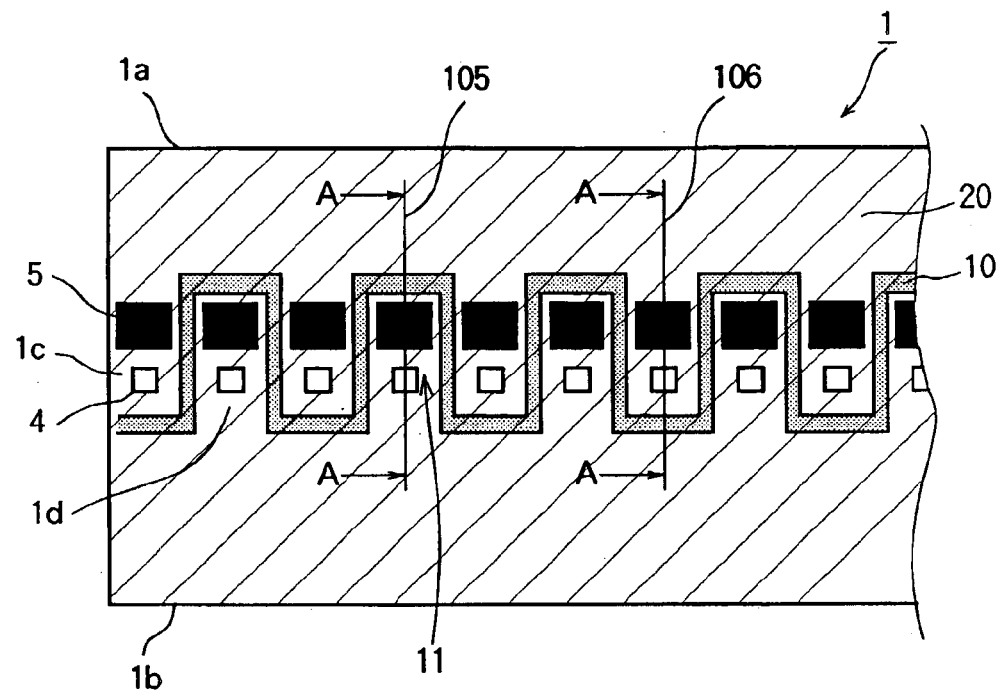
FIG. 5A is a plan view illustrating a step in the fabrication of the LED array in FIG. 1.
Figure 5B:
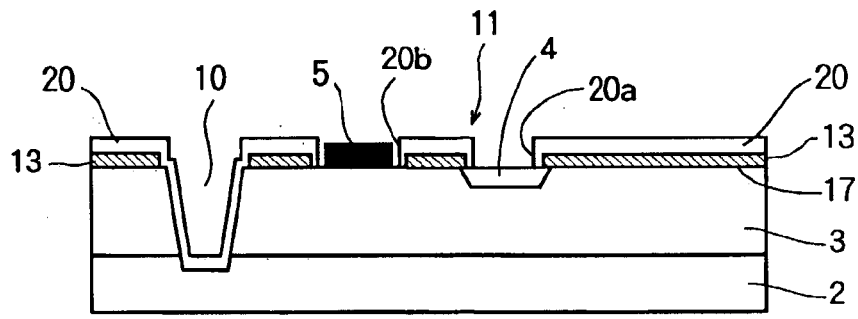
FIG. 5B is a sectional view through index line 105 in FIG. 5A, as seen from the direction of arrows A.
Figure 5C:
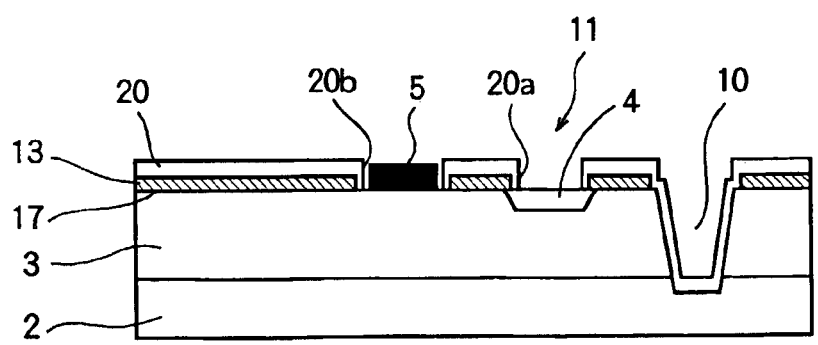
FIG. 5C is a sectional view through index line 106 in FIG. 5A, as seen from the direction of arrows A.

FIGS. 4A to 4C and FIGS. 5A to 5C show subsequent fabrication steps. FIGS. 4A and 5A are plan views; FIGS. 4B and 5B show sectional views through index line 105 in FIGS. 4A and 5A, respectively, as seen from the direction of arrows A, while FIGS. 4C and 5C show sectional views through index line 106 in FIGS. 4A and 5A, respectively, as seen from the direction of arrows A.

As shown in FIGS. 4A, 4B, and 4C, in order to form the isolation trench 10, the diffusion mask 13 is first removed from a square-wave-shaped ribbon-like region extending generally in the longitudinal direction of the LED array 1. This ribbon-like region is then etched at least as far down as the high-resistance substrate 2, as shown in FIGS. 4B and 4C, to form the isolation trench 10. The etching is carried out by a wet etching procedure using an etchant such as a solution of phosphoric acid and hydrogen peroxide. The LED array 1 is thereby divided into two electrically isolated semiconductor blocks 1a and 1b facing each other with interlocked comb-tooth-like projections 1c and 1d. The isolation trench 10 divides the linear array of p-type semiconductor diffusion regions 4 into segments disposed alternately in semiconductor blocks 1a and 1b, each segment including just one p-type semiconductor diffusion region 4.

Next, as shown in FIGS. 5A to 5C, an intermediate dielectric film 20 is formed on the entire major surface of the LED array 1, except for areas 20a above the p-type semiconductor diffusion regions 4 and areas 20b in which n-electrodes will be formed in the comb-tooth-like projections 1c and 1d of the semiconductor blocks 1a and 1b. In this step in this embodiment, first a silicon-nitride (SiN) dielectric film 500 Å to 3000 Å thick, for example, is formed; then, photolithography is carried out to define the above areas 20a and 20b, and the SiN dielectric film is removed from these areas by etching. FIGS. 2A, 2B, and 2C show the intermediate dielectric film as if it were part of the first dielectric film 13.

Next, as shown in FIGS. 5A to 5C, the n-electrodes 5 are formed in areas 20b. In this embodiment, the n-electrodes 5 are formed on the n-type semiconductor layer 3 by deposition of a gold alloy material followed by lift-off of unwanted portions. The n-electrodes 5 are then sintered to form ohmic contacts.

Figure 6:
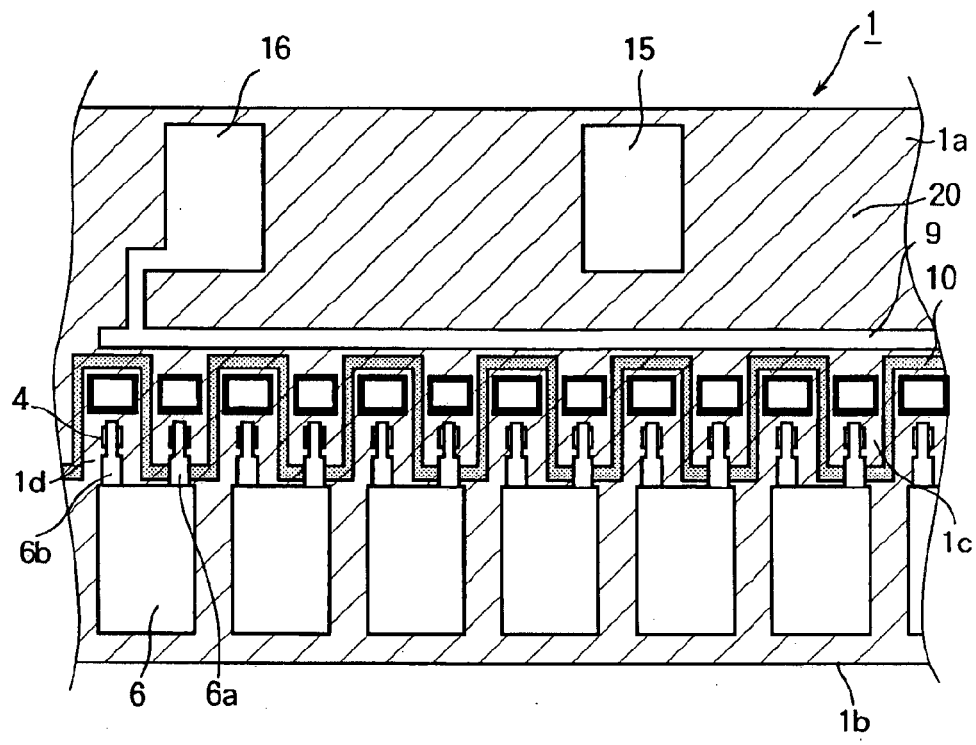
FIGS. 6 and 7 are plan views illustrating further steps in the fabrication of the LED array in FIG. 1.
Figure 7:
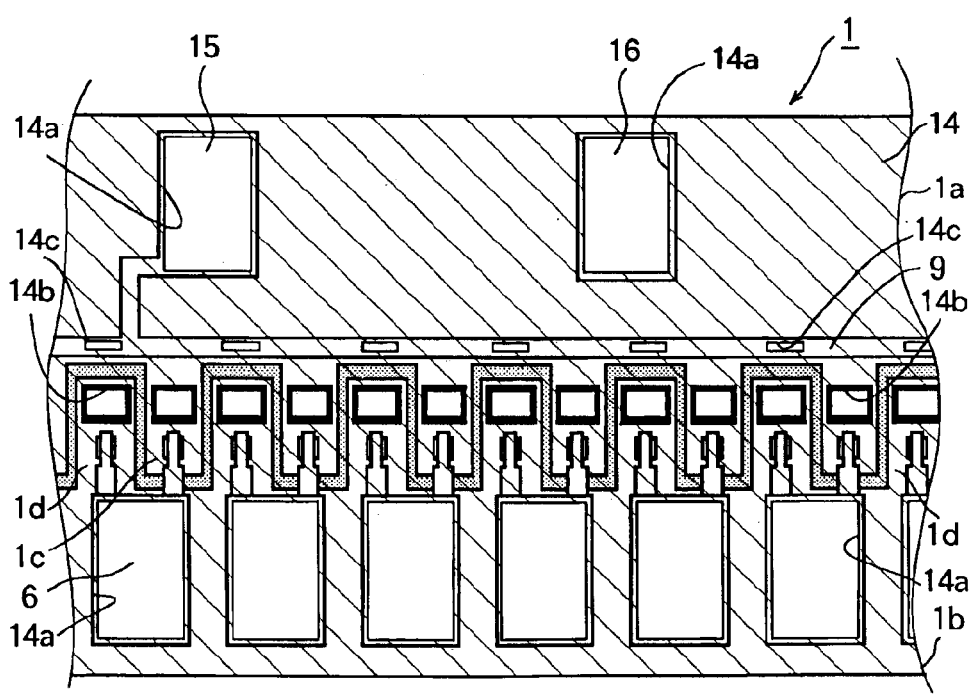

FIGS. 6 and 7 are plan views of the LED array 1 showing the subsequent fabrication steps. As shown in FIG. 6, after the n-electrodes 5 have been formed, the anode interconnecting pads 6, their first and second leads 6a, 6b, the first cathode interconnecting pad 15, the second cathode interconnecting pad 16, and its lower shared interconnecting line 9 are simultaneously formed on the intermediate dielectric film 20 by deposition and lift-off of a gold alloy or other suitable material. The first and second leads 6a, 6b of the anode interconnecting pads 6 make individual contact with the p-type semiconductor diffusion regions 4 through the openings in the areas 20a of the intermediate dielectric film 20 shown in FIGS. 5B and 5C. Sintering is carried out to form ohmic contacts.

Next, as shown in FIG. 7, the second dielectric film 14 is formed on the entire major surface of the LED array 1, except for pad areas 14a in which the anode interconnecting pads 6, first cathode interconnecting pad 15, and second cathode interconnecting pad 16 are left exposed, n-electrode areas 14b in which the n-electrodes 5 are left exposed, and connection areas 14c in which the lower shared interconnecting line 9 is left exposed. The connection areas 14c face the n-electrode areas 14b in comb-tooth-like projections 1d.

Then the upper shared interconnecting line 7, its branch leads 7a, and the interconnecting leads 8 are formed simultaneously on the second dielectric film 14 by deposition and lift-off of a material such as a gold alloy. As shown in FIG. 1, the interconnecting leads 8 electrically couple the lower shared interconnecting line 9 to the n-electrodes 5 in comb-tooth-like projections 1d through the openings formed in the second dielectric film 14 in the connecting areas 14c and in the n-electrode areas 14b in comb-tooth-like projections 1d. The upper shared interconnecting line 7 and its branch leads 7a electrically couple the n-electrodes 5 in comb-tooth-like projections 1c to the first cathode interconnecting pad 15 through the openings in the second dielectric film 14 formed in the pad regions 14a and the n-electrode areas 14b in comb-tooth-like projections 1c.

A method of driving the LED array 1 will now be described with reference to the plan view in FIG. 1. To facilitate the description, the light-emitting elements 11 in FIG. 1 are numbered D1, D2, D3, D4, . . . in sequence from the left in FIG. 1. The n-electrodes 5 in the odd-numbered light-emitting elements 11 are all electrically coupled to the second cathode interconnecting pad 16, the n-electrodes 5 in the even-numbered light-emitting elements 11 are all electrically coupled to the first cathode interconnecting pad 15, and the first and second leads 6a and 6b of each anode interconnecting pad 6 are electrically coupled as p-electrodes to the p-type regions in a consecutive pair of light-emitting elements 11.

Desired light-emitting elements are driven by electrically selecting the anode interconnecting pads 6 and the first or second cathode interconnecting pad 15 and supplying forward current from the p-side to the n-side. To drive an odd-numbered light-emitting element such as light-emitting element D5, for example, the anode interconnecting pad 6 connected to its anode electrode and the second cathode interconnecting pad 16 are selected, and forward current is supplied. Likewise, to drive an even-numbered light-emitting element such as light-emitting element D10, the anode interconnecting pad 6 connected to its anode electrode and the first cathode interconnecting pad 15 are selected, and forward current is supplied.

In this matrix driving scheme, 2n light-emitting elements can be driven by using two cathode interconnecting pads and n separate anode interconnecting pads, where n is a positive integer.

In the LED array 1 according to the first embodiment, the cathode electrodes are divided into two groups, and a shared cathode interconnecting pad is provided for each group, thereby enabling the number of anode interconnecting pads to be reduced by half. Since the isolation trench that separates the two groups is formed in a square-wave pattern, the number of interconnecting lines crossing the isolation trench is greatly reduced. More specifically, the branch leads 7a of the upper shared interconnecting line 7 and the second leads 6b of the anode interconnecting pads 6 do not cross the isolation trench 10.

There is a general tendency for interconnecting lines formed on the sloping side walls of a trench to be thinner than interconnecting lines formed on a flat surface, and therefore more prone to failures such as open circuits. In the LED array 1 in this embodiment, the probability of such failures is reduced because the number of interconnecting lines crossing the trench is reduced.

In the above embodiment, the high-resistance substrate 2 functions as a current blocking layer, enabling the isolation trench 10 to divide the n-type semiconductor layer 3 into mutually isolated regions. In place of the high-resistance substrate 2, however, a semiconductor substrate of the conductive type opposite to the n-type semiconductor layer 3 (that is, a p-type semiconductor substrate) may be employed as a current blocking layer. Alternatively, instead of having the substrate function as a current-blocking layer, a separate current-blocking layer (either a high-resistance layer or a layer of the opposite conductive type) may be formed between the semiconductor layer 3 and the substrate, in which case the conductive type and resistivity of the substrate are immaterial.

Second Embodiment

Figure 9A:
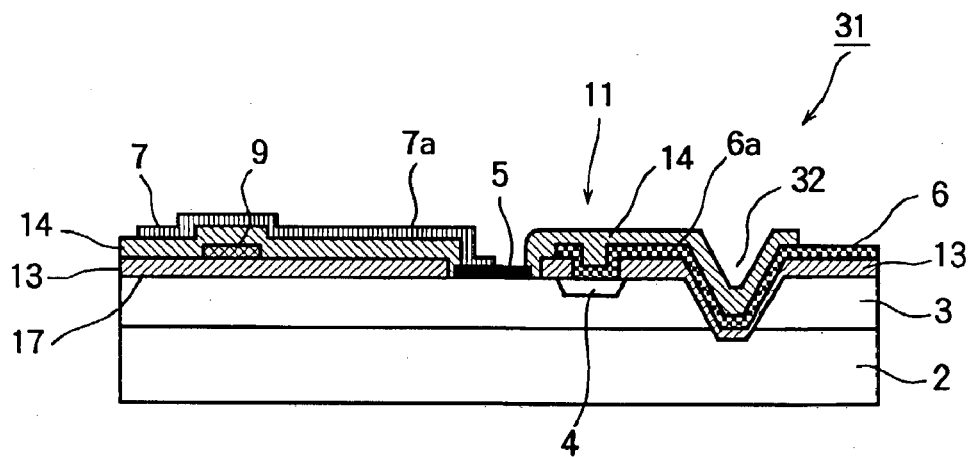
FIG. 9A is a sectional view through index line 201 in FIG. 8, as seen from the direction of arrows A.
Figure 9B:
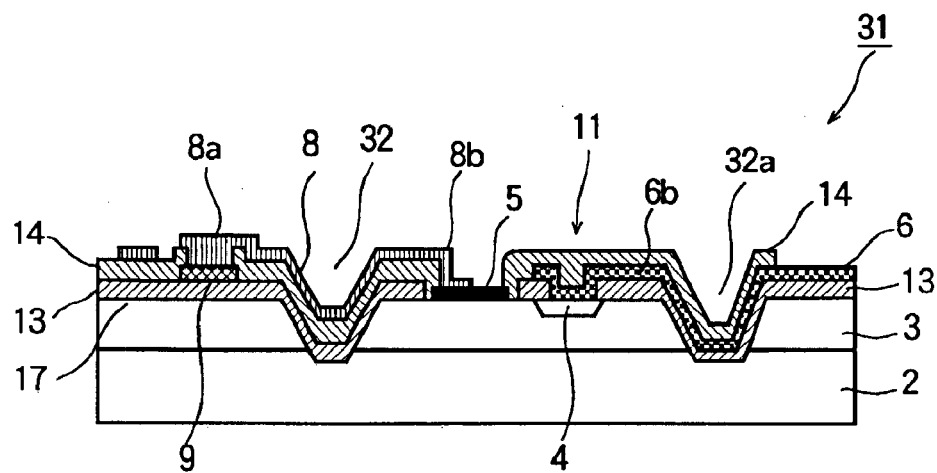
FIG. 9B is a sectional view through index line 202 in FIG. 8 as seen from the direction of arrows A.
Figure 9C:
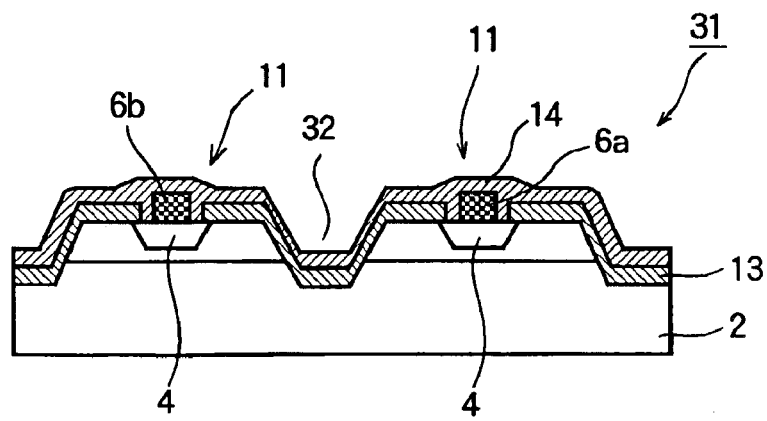
FIG. 9C is a sectional view through index line 203 in FIG. 8 as seen from the direction of arrows B.

FIG. 8 is a plan view of part of an LED array 31 illustrating a second embodiment of the present invention. FIGS. 9A, 9B, and 9C show sectional views through index lines 201, 202, and 203, respectively, in FIG. 8, seen from the direction of arrows A and B.

The LED array 31 in the second embodiment differs from the LED array 1 shown in FIG. 1 in the first embodiment in that the isolation trench 32 is formed so as to create island-like semiconductor blocks 33. The following description will focus on the differences between the first embodiment and the second embodiment, omitting descriptions of component elements that are the same as in the first embodiment.

As shown in FIG. 8, the isolation trench 32 in the second embodiment divides the n-type semiconductor layer 3 into a first semiconductor block 1a and a remaining semiconductor region, as in the first embodiment, but the isolation trench now includes a continuous straight lane 32a that divides the remaining semiconductor region into a plurality of island-like blocks 33 and a single rectangular block 34.

The island-like blocks 33, which include the odd-numbered light-emitting elements 11, are electrically independent of other regions. The comb-tooth-like projections 1c of semiconductor block 1a, which include the even-numbered light-emitting elements 11, are electrically continuous with one another as in the first embodiment. As shown in FIG. 9A, the first leads 6a of the anode interconnecting pads 6 cross the isolation trench 32 as they did in the first embodiment. As shown in FIG. 8, these crossings occur in the straight lane 32a. As shown in FIG. 9B, the second leads 6b of the anode interconnecting pads 6 in the LED array 31 also cross the straight lane 32a of the isolation trench.

Aside from the different isolation trench configuration, the same fabrication process can be used for this LED array 31 as for the LED array 1 in the first embodiment, and the driving method is also the same. Descriptions of the fabrication process and driving method will therefore be omitted.

In the LED array 31 in the second embodiment, the n-type semiconductor layer 3 in the rectangular block 34, which serves as a base for the anode interconnecting pads 6, is electrically isolated from the array of light-emitting elements 11. Accordingly, even if an anode interconnecting pad 6 and the underlying first dielectric film 13 are unintentionally pierced in the wire-bonding process, no short circuit is formed between the anode interconnecting pad 6 and the n-type semiconductor layer 3 in the light-emitting elements 11. Manufacturing yields of the LED array are therefore improved.

Third Embodiment

Figure 10A:
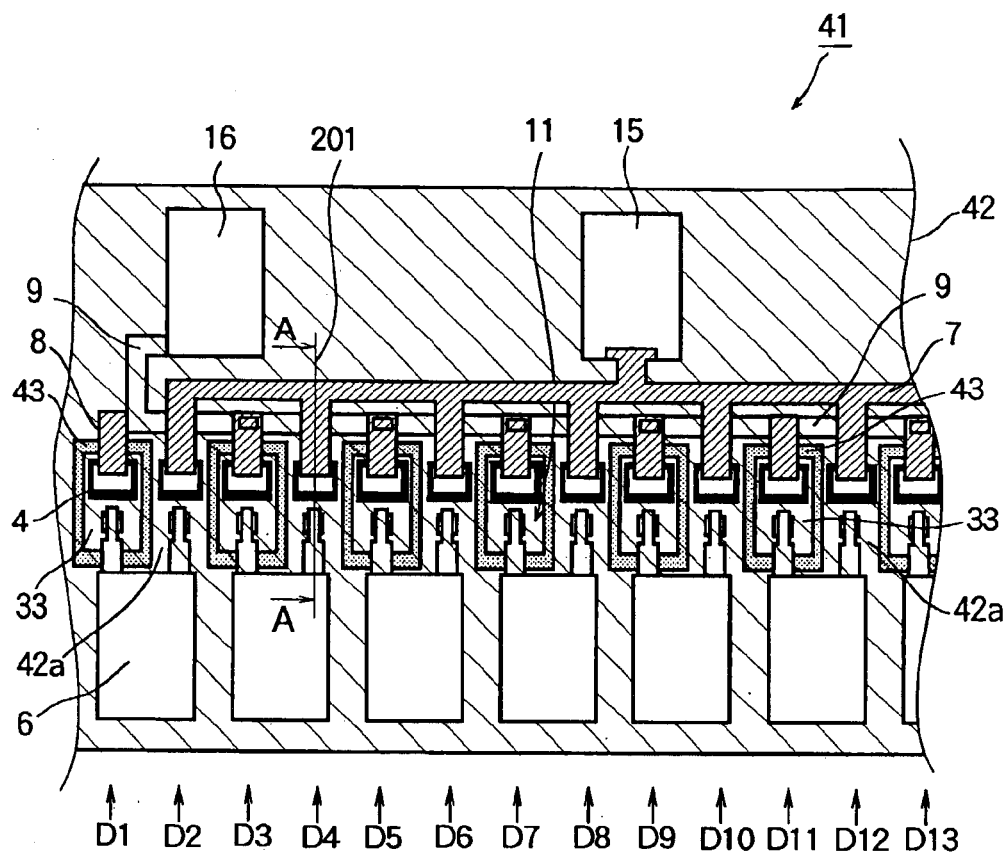
FIG. 10A is a plan view of part of an LED array illustrating a third embodiment of the invention.
Figure 10B:
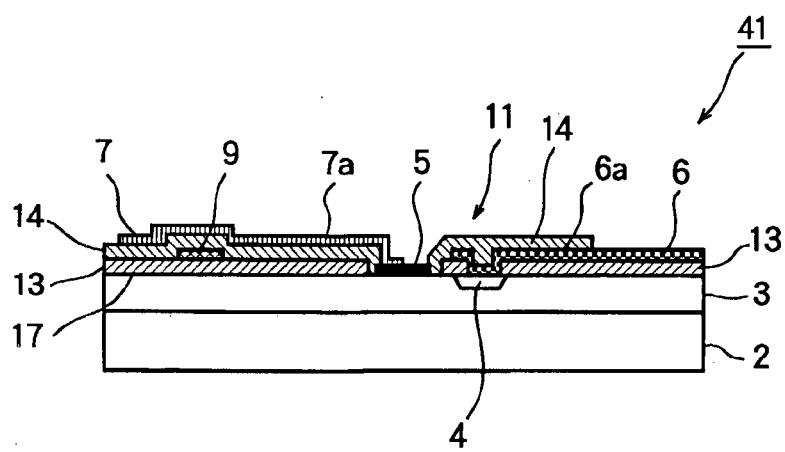
FIG. 10B is a sectional view through index line 201 in FIG. 10A, as seen from the direction of arrows A.

FIGS. 10A and 10B show part of an LED array 41 illustrating a third embodiment of the present invention. FIG. 10A is a plan view, while FIG. 10B is a sectional view through index line 201 in FIG. 10A, seen from the direction of the arrows marked A.

The LED array 41 in the third embodiment differs from the LED array 31 shown in FIG. 8 in the second embodiment in that the isolation trench comprises a plurality of separate closed loops 43 surrounding the island-like blocks 33. The following description will focus on the difference between the second and third embodiments, omitting descriptions of component elements that are the same as in the first and second embodiments.

As shown in FIG. 10A, the isolation trench loops 43 make the island-like blocks 33, which include the odd-numbered light-emitting elements 11, independent of other regions. The comb-tooth-like projections 1c of semiconductor block 1a, shown in FIG. 8, which include the even-numbered light-emitting elements 11, are now continuous with the rectangular block 34 in FIG. 8, the parts of the straight lane 32a of the isolation trench that separated them from the rectangular block 34 in FIG. 8 having been removed. The comb-tooth-like projections 1c thus become bridges 42a in FIG. 10A.

Accordingly, the semiconductor block 1a and the separate rectangular block 34 in the LED array 31 in the second embodiment are connected in the LED array 41 in the third embodiment to form a continuous first semiconductor region 42. As shown in the sectional view in FIG. 10B, the first leads 6a of the anode interconnecting pads 6 in the LED array 41 are formed on a flat surface, without crossing the isolation trenches 43.

Aside from the different isolation trench configuration, the same fabrication process can be used for this LED array 41 as for the LED array 1 in the first embodiment, and the driving method is also the same. Descriptions of the fabrication process and driving method will therefore be omitted.

As explained above, according to the LED array 41 in the third embodiment, the number of conductive lines that cross the isolation trenches is reduced, as in the LED array 1 in the first embodiment. The probability of failures such as open circuits or the like caused by the thinness of the interconnecting lines formed on the sloping side walls of the trenches is thereby reduced.

Fourth Embodiment

FIG. 11 a plan view of part of an LED array 51 illustrating a fourth embodiment of the present invention.

The LED array 51 in the fourth embodiment differs from the LED array 1 in the first embodiment, shown in FIG. 1, in that the isolation trench 52 that weaves through the array of light-emitting elements 11 divides the array into segments of two light-emitting elements each, these segments being alternately disposed in semiconductor blocks 51a and 51b. Because of this arrangement, the locations at which the n-electrodes 5 are connected to the upper and lower shared interconnecting lines 53 and 54 are changed, which constitutes another difference. The following description will focus on the differences between the first and fourth embodiments, omitting descriptions of component elements that are the same as in the first embodiment.

The isolation trench 52 is etched through the n-type semiconductor layer 3 (shown in FIGS. 2A and 2B) in a square-wave pattern extending in the longitudinal direction of the LED array 51 in FIG. 11. The LED array 51 is thereby divided into two electrically isolated semiconductor blocks 51a and 51b facing each other with interlocking comb-tooth-like projections 51c and 51d.

Two adjacent light-emitting elements 11 are disposed in each of the comb-tooth-like projections 51c and 51d. The upper shared interconnecting line 53 electrically couples the pairs of n-electrodes 5 disposed in the comb-tooth-like projections 51c of semiconductor block 51a to the first cathode interconnecting pad 15. The interconnecting leads 8 and the lower shared interconnecting line 54 electrically couple the pairs of n-electrodes 5 disposed in the comb-tooth-like projections 51d of semiconductor block 51b to the second cathode interconnecting pad 16.

Each of the anode interconnecting pads 6 is formed so that its first and second leads 6a and 6b contact the p-type semiconductor diffusion regions 4 in a pair of mutually adjacent light-emitting elements 11 disposed in different comb-tooth-like projections.

Aside from the different isolation trench configuration and different interconnections of the upper and lower shared interconnecting lines 53 and 54, the same fabrication process can be used for this LED array 51 as for the LED array 1 in the first embodiment. Descriptions of the fabrication process will therefore be omitted.

A method of driving the LED array 51 formed as described above will be described with reference to the plan view in FIG. 11. To facilitate the description, the light-emitting elements 11 in FIG. 11 are numbered D1, D2, D3, D4, . . . in sequence from the left in FIG. 11.

Desired light-emitting elements are driven by electrically selecting the anode interconnecting pads 6 and the first or second cathode interconnecting pad 15 or 16 and supplying forward current from the p-side to the n-side.

To drive a light-emitting element or element such as light-emitting element D5 disposed in semiconductor block 51b, for example, the anode interconnecting pad 6 connected to its anode electrode and the second cathode interconnecting pad 16 are selected, and forward current is supplied. Likewise, to drive a light-emitting element such as light-emitting element D10 disposed in semiconductor block 51a, the anode interconnecting pad 6 connected to its anode electrode and the first cathode interconnecting pad 15 are selected, and forward current is supplied.

As in the preceding embodiments, 2n light-emitting elements can be driven by using two cathode interconnecting pads and n separate anode interconnecting pads, where n is a positive integer.

The LED array 51 according to the fourth embodiment provides the effects noted in the first embodiment. In addition, the number of turns in the square-wave pattern of the isolation trench 52 is reduced, thereby shortening the overall length of the isolation trench. This reduces the probability that a conductive particle will lodge in the isolation trench during photolithography and etching steps in the semiconductor fabrication process, causing a failure by electrically interconnecting the upper and lower semiconductor blocks. Manufacturing yields of the LED array are therefore improved.

Fifth Embodiment

Figure 12A:
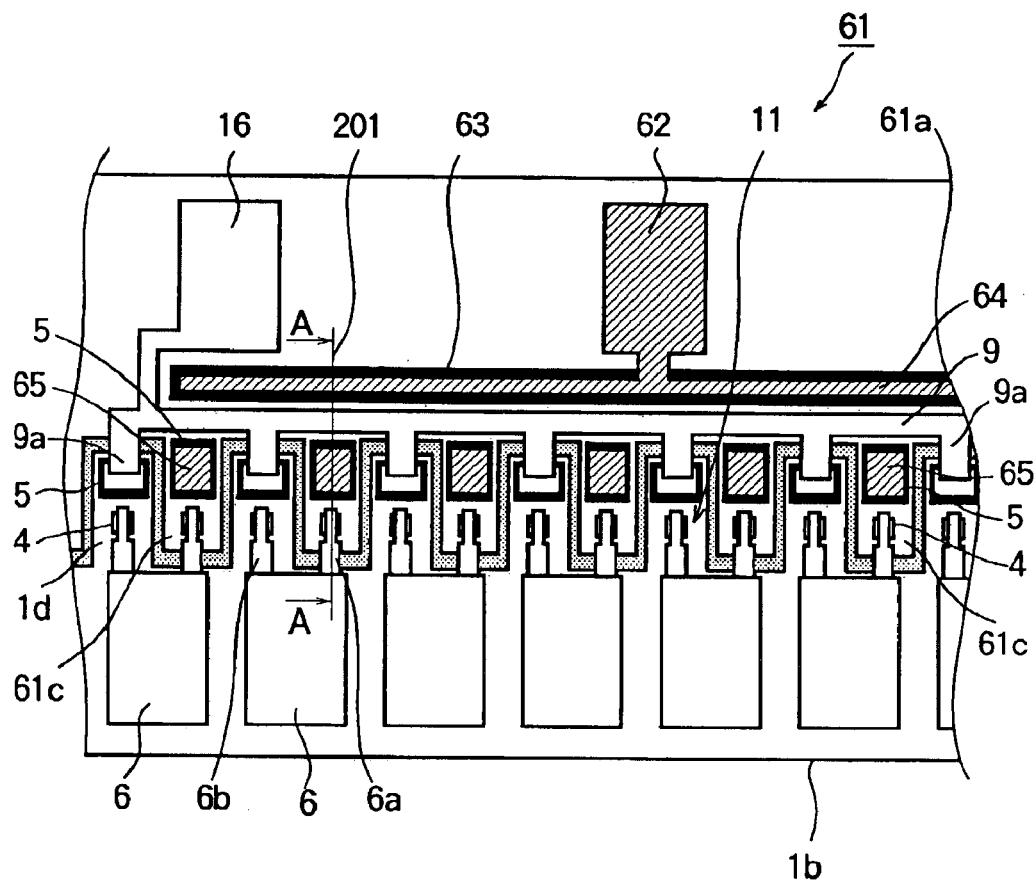
FIG. 12A is a plan view of part of an LED array illustrating a fifth embodiment of the invention.
Figure 12B:
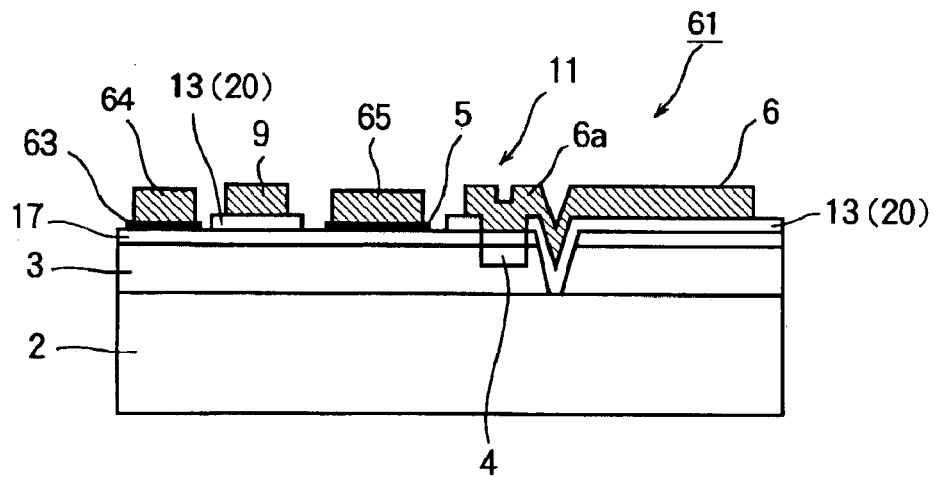
FIG. 12B is a sectional view through index line 201 in FIG. 12A, as seen from the direction of arrows A.

FIGS. 12A and 12B show part of an LED array 61 according to a fifth embodiment of the present invention. FIG. 12A is a plan view, while FIG. 12B is a sectional view through index line 201 in FIG. 10A, seen from the direction of the arrows marked A.

The LED array 61 in the fifth embodiment differs from the LED array 1 shown in FIG. 1 in the first embodiment in the manner in which the n-electrodes in comb-tooth-like projections in the first semiconductor region are electrically coupled to the first cathode interconnecting pad. The following description will focus on the differences between the first embodiment and the fifth embodiment, omitting descriptions of component elements that are the same as in the first embodiment.

LED array 61 has a shared electrode 63, made of a gold alloy, that may be formed simultaneously with the n-electrodes 5 in the step described in the first embodiment. The n-electrodes 5 disposed in comb-tooth-like projections 61c of semiconductor block 61a are made large enough to closely approach the lower shared interconnecting line 9 that will be formed later, and the shared electrode 63 is formed closely parallel to the lower shared interconnecting line 9 on the opposite side thereof from the n-electrodes 5.

Accordingly, the intermediate dielectric film 20 is removed from an area in which the shared electrode 63 will be formed as well as from the light-emitting areas 20a and the n-electrode formation areas 20b in FIGS. 5A and 5B. FIG. 12B shows the diffusion mask and the intermediate dielectric film (20) as a single first dielectric film 13. There is no second dielectric film.

When the first cathode interconnecting pad 62 is formed, a shared cathode interconnecting line 64 extending from the first cathode interconnecting pad 62 onto the shared electrode 63 is formed simultaneously, and interconnecting sheets 65 are also formed on the n-electrodes 5 in the comb-tooth-like projections 61c. The anode interconnecting pads 6, the second cathode interconnecting pad 16, and the lower shared interconnecting line 9 may also be formed in this step, as described in the first embodiment.

In the first embodiment, the interconnecting leads 8 shown in FIG. 1 were formed in a subsequent step. In the fifth embodiment, however, the interconnecting leads 9a are integral with the lower shared interconnecting line 9, and are formed at the same time as the lower shared interconnecting line 9.

With this arrangement, the n-electrodes 5 in the comb-tooth-like projections 61c are electrically coupled to the first cathode interconnecting pad 62 through the GaAs contact cap layer 17, n-type semiconductor layer 3, GaAs contact cap layer 17, shared electrode 63, and shared cathode interconnecting line 64, in this order. Together with the interconnecting sheets 65, these elements form an electrical path that does not cross the isolation trench.

The GaAs contact cap layer 17 has a high impurity concentration and is formed to create an ohmic contact between the n-type semiconductor layer 3 on the one hand and the shared electrode 63 and n-electrodes 5 on the other hand. Although the LED array can operate without the n-electrodes 5 and interconnecting sheets 65, operating efficiency would be reduced, because current would have to flow for a longer distance through the n-type semiconductor layer 3, which has a higher resistance than the n-electrodes 5 and interconnecting sheets 65. The n-electrodes 5 and interconnecting sheets 65 are desirable because they allow current to bypass part of the n-type semiconductor layer 3.

The other fabrication steps and the driving method are the same as in the LED array 1 in the first embodiment. Descriptions of these steps and method will therefore be omitted.

By connecting the first cathode interconnecting pad 62 to the shared electrode 63 for substantially the entire length of the shared electrode 63, the shared cathode interconnecting line 64 reduces the resistance of the electrical path extending from the first cathode interconnecting pad 62. If the resistivity of the shared electrode 63 is already satisfactorily low, however, the shared cathode interconnecting line 64 can be shortened to connect the first cathode interconnecting pad 62 to the shared electrode 63 for only part of the length of the shared electrode 63.

As described above, the LED array 61 in the fifth embodiment has an interconnection configuration that completely avoids overlapping metal wiring. Thus, all necessary metalization can be performed in one step and the number of dielectric films can be reduced by one. As compared with the first embodiment, the wiring configuration is simplified and the number of fabrication steps can be reduced, contributing to an improvement in manufacturing yields and a reduction in cost.

Sixth Embodiment

Figure 13:
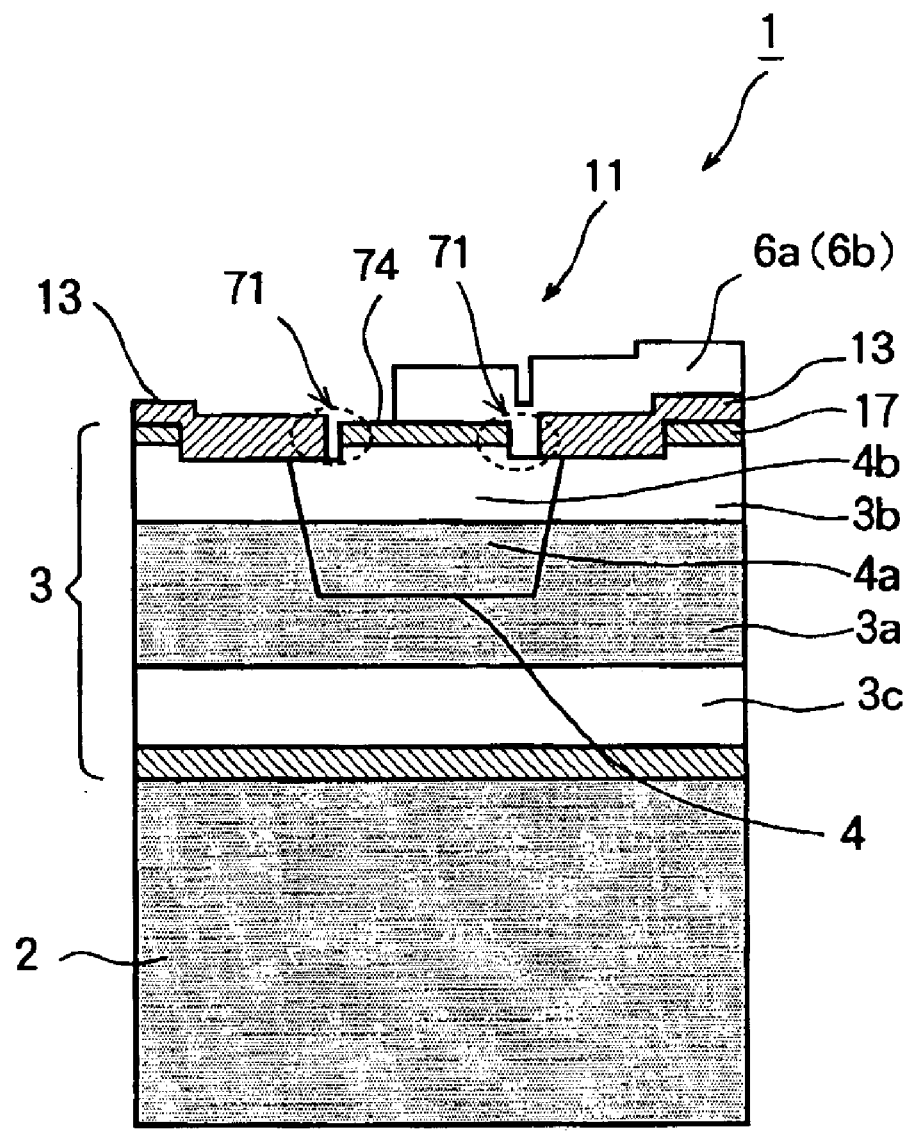
FIG. 13 is a sectional view of part of a light-emitting element in an LED array illustrating a sixth embodiment of the invention.

FIG. 13 shows a light-emitting element 11 in an LED array 1 according to a sixth embodiment of the present invention. It will be assumed that the LED array 1 has the same overall structure as in the first embodiment.

A semi-insulating GaAs substrate 2 or other high-resistance substrate, on which an n-type semiconductor layer 3 has been epitaxially grown, is employed as the substrate of the LED array 1. The n-type semiconductor layer 3 comprises at least three AlGaAs semiconductor layers: an n-type $Al_yGa_{1-y}As$ light-emitting layer 3a, the parameter y of which determines the emission wavelength (1>y>0); an overlying n-type $Al_zGa_{1-z}As$ layer 3b (1>z>y>0); and an underlying n-type $Al_xGa_{1-x}As$ layer 3c (1>x>y>0). In order to obtain a light emission wavelength close to, for example, seven hundred sixty nanometers (760 nm), y may be set equal to 0.15, while x and z are set equal to 0.6.

The p-type semiconductor diffusion region 4 comprises a p-type $Al_yGa_{1-y}As$ light-emitting layer 4a disposed within the n-type $Al_yGa_{1-y}As$ light-emitting layer 3a, a p-type $Al_zGa_{1-z}As$ layer 4b disposed within the n-type $Al_zGa_{1-z}As$ layer 3b, and a p-type GaAs contact region 74. The p-type GaAs contact region 74 is part of a GaAs contact cap layer 17 formed on the n-type semiconductor layer 3 as a top layer for making ohmic electrical contact with, for example, the n-electrodes 5 (shown in FIG. 1) and the leads 6a, 6b of the anode interconnecting pads 6.

To obtain the desired light-emission wavelength, the zinc diffusion process is controlled so that the bottom diffusion front of each p-type semiconductor diffusion region 4 is located within the n-type $Al_yGa_{1-y}As$ layer 3a, and the pn junction at the lateral diffusion front is removed from at least regions 71 in the GaAs contact cap layer 17 and its interface with the underlying $Al_zGa_{1-z}As$ layer 3b. Thus no pn junctions are formed in an n-type semiconductor layer with a lower aluminum content than the aluminum content (y) of the light-emitting n-type $Al_yGa_{1-y}As$ layer 3a.

Next, a method of fabricating the light-emitting element in the sixth embodiment will be described with reference to FIGS. 14A to 14D.

Figure 14A:
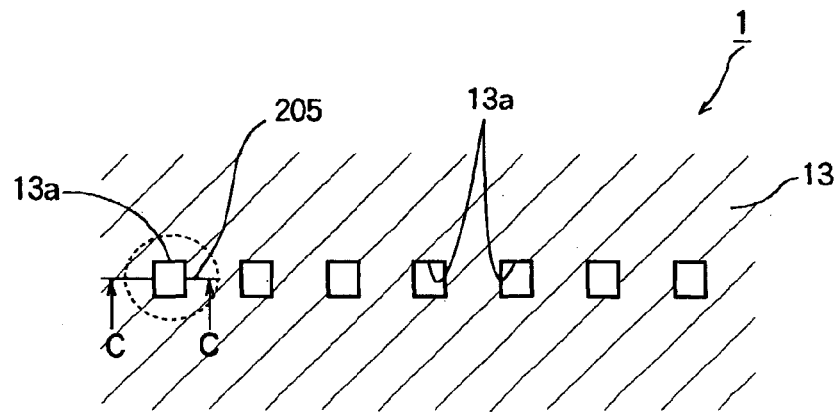
FIG. 14A is a plan view illustrating a step in the fabrication of the LED array in FIG. 13.
Figure 14B:
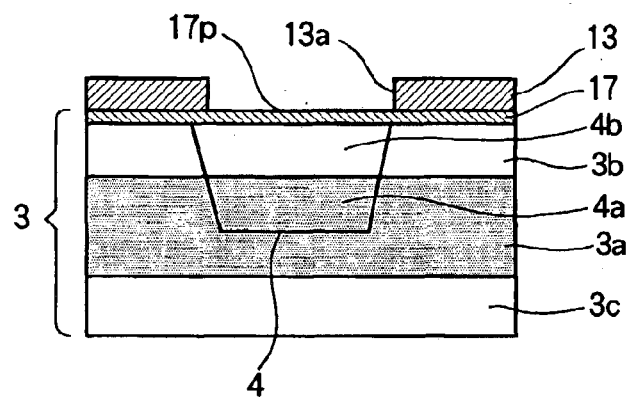
FIG. 14B is a sectional view through index line 205 in FIG. 14A, as seen from the direction of arrows C.

Referring to FIGS. 14A and 14B, the first dielectric film 13, which serves as the diffusion mask, is formed on the GaAs contact cap layer 17, which is the top layer of the substrate. Then openings 13a are formed at locations corresponding to the light-emitting elements by photolithography and etching, and zinc is selectively diffused into the substrate through the openings 13a to form p-type semiconductor diffusion regions 4. As shown in FIG. 14B, the diffusion depth is controlled so that the bottom diffusion front of each p-type semiconductor diffusion region 4 is located within the n-type $Al_yGa_{1-y}As$ light-emitting layer 3a.

At this point, the p-type diffusion region 4 comprises a p-type $Al_yGa_{1-y}As$ light-emitting layer 4a disposed within the n-type $Al_yGa_{1-y}As$ light-emitting layer 3a, a p-type $Al_zGa_{1-z}As$ layer 4b disposed within the n-type $Al_zGa_{1-z}As$ layer 3b, and a p-type GaAs contact region 17p disposed within the GaAs contact cap layer 17.

Figure 14C:
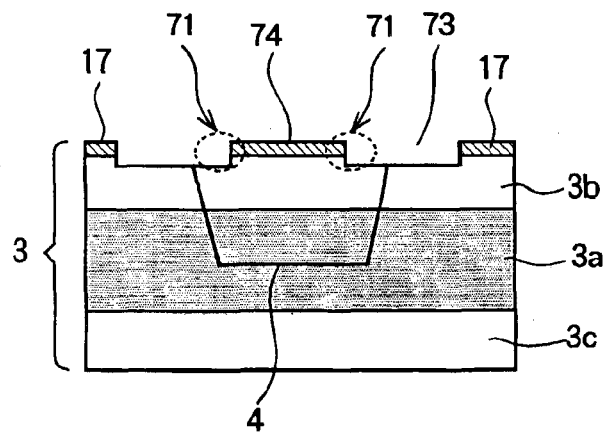
FIG. 14C is a sectional view illustrating a further step in the fabrication of the LED array in FIG. 13.

Next, as shown in FIG. 14C, material including the lateral diffusion front in the GaAs contact cap layer 17 and its interface with the underlying n-type $Al_zGa_{1-z}As$ layer 3b is removed by etching so that no pn junctions are left within regions 71 having a lower aluminum content than that of the light-emitting n-type $Al_yGa_{1-y}As$ layer 3a.

Figure 14D:
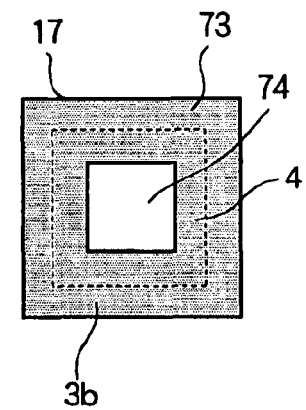
FIG. 14D is a plan view illustrating the fabrication step in FIG. 14C.

In this embodiment, the first dielectric film 13 is removed by etching from the peripheries of the openings 13a. Then the n-type GaAs contact cap layer 17 is removed by etching from annular regions 73 surrounding the contact regions 74 where the electrodes will be formed, as shown in FIG. 14D. The removed regions 73 include the boundaries between the p-type semiconductor diffusion regions 4 and the surrounding n-type GaAs contact cap layer 17. The etched regions 73 extend through the interface between the n-type GaAs contact cap layer 17 and the underlying n-type $Al_zGa_{1-z}As$ layer 3b.

Next, the isolation trench 10 shown in FIG. 1 is formed as described in the first embodiment. Subsequent steps are also performed as in the first embodiment, so descriptions will be omitted.

The light-emitting elements in the sixth embodiment have an enhanced light-emitting efficiency that enables sufficient light emission to be obtained with a relatively low driving current. Accordingly, inexpensive driver ICs can be employed, and the overall cost of, for example, an electrophotographic printing head including the LED array can be reduced accordingly.

Seventh Embodiment

Figure 15:
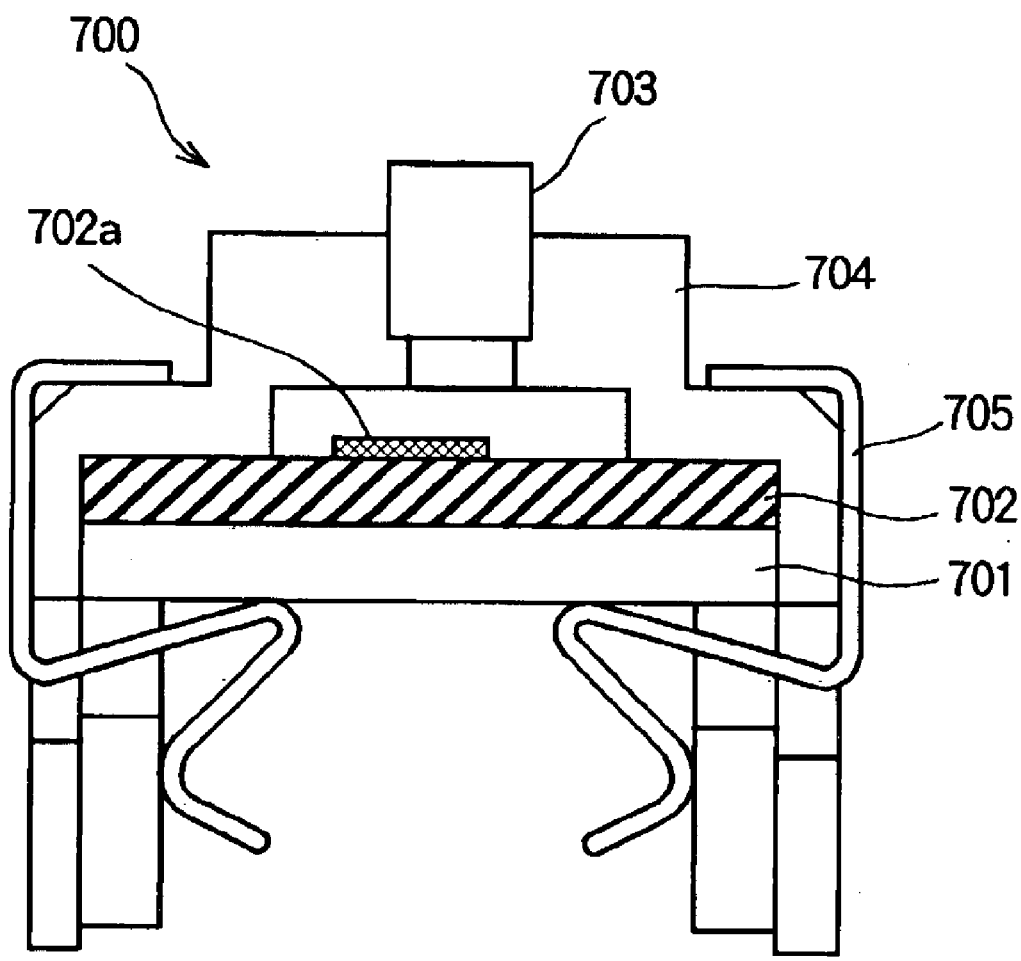
FIG. 15 is a sectional view of an LED printing head illustrating a seventh embodiment of the invention.

FIG. 15 shows an example of an LED printing head 700 embodying the present invention. The LED printing head 700 includes a base 701 on which an LED unit 702 is mounted. The LED unit 702 includes a plurality of LED arrays of the type described in any of the preceding embodiments, aligned end to end to form a single linear array of light-emitting elements. The LED unit 702 also includes driver ICs to which the LED arrays are electrically coupled by wire-bonding. The LED arrays and driver ICs are mounted in area 702a, the light-emitting elements being positioned beneath a rod lens array 703. The linear array is seen here in cross-section.

The rod lens array 703 is supported by a holder 704. The base 701, LED unit 702, and holder 704 are held together by clamps 705. Light emitted by the light-emitting elements in the LED unit 702 is focused by rod lenses in the rod lens array 703 onto, for example, a photosensitive drum (not shown) in an electrophotographic printer or copier.

Eighth Embodiment

Figure 16:
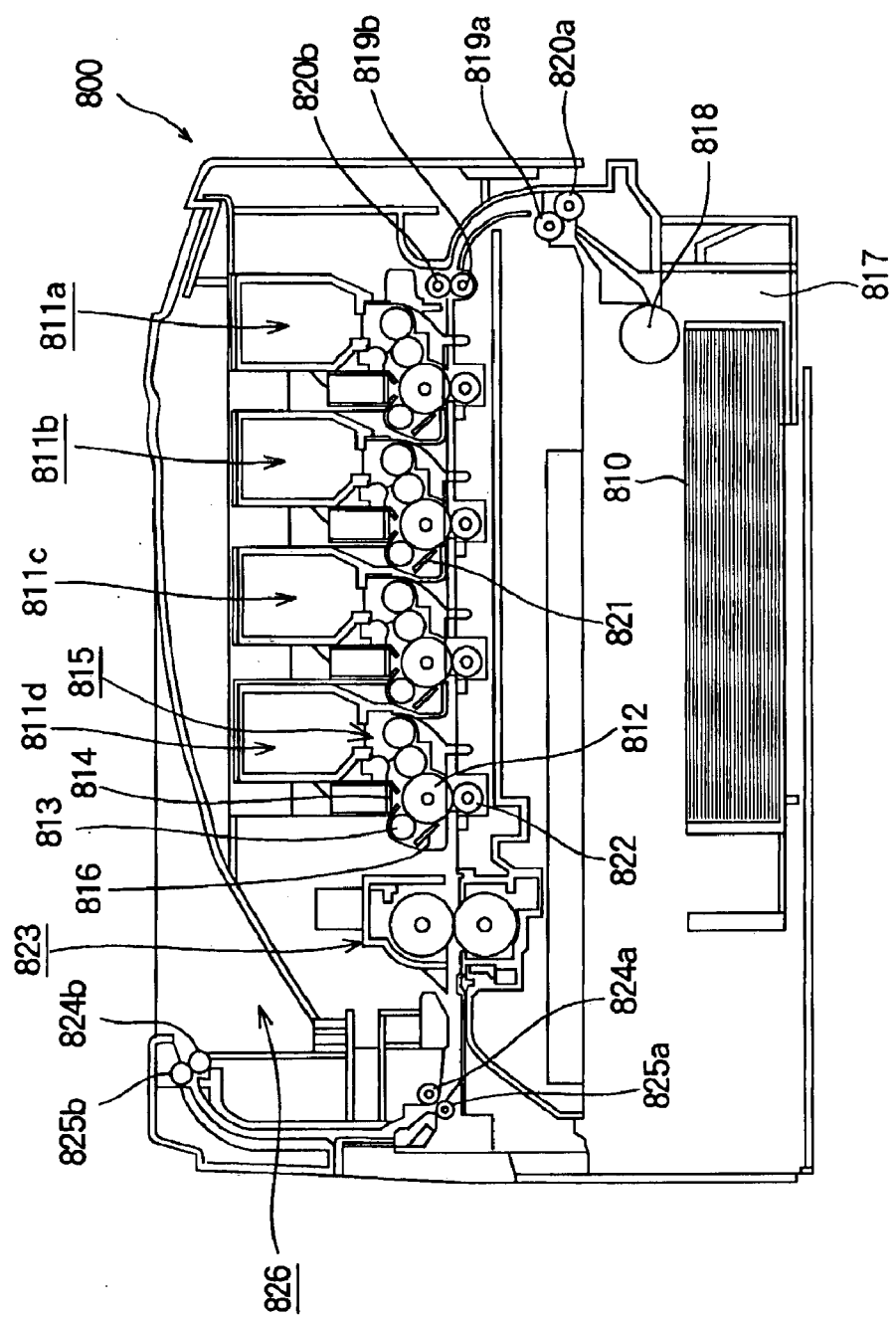
FIG. 16 is a sectional view of an LED color printer illustrating an eighth embodiment of the invention.

FIG. 16 shows an example of an LED color printer 800 embodying the present invention. The printer 800 sends printing media such as paper 810 through a yellow process unit 811a, a magenta process unit 811b, a cyan process unit 811c, and a black process unit 811d, which are mounted following one another in tandem fashion. Each process unit 811a, 811b, 811c, 811d includes a photosensitive drum 812, a charging unit 813 that supplies current to the photosensitive drum 812 to charge the surface thereof, an LED printing head 814 that selectively illuminates the charged surface of the photosensitive drum 812 to form an electrostatic latent image, a developing unit 815 that supplies toner particles to the surface of the photosensitive drum 812 to develop the electrostatic latent image, and a cleaning unit 816 that removes remaining toner from the photosensitive drum 812 after the developed image has been transferred to the paper 810. The LED printing head 814 has, for example, the structure described in the seventh embodiment, and includes LED arrays of the type described in any of the first six embodiments.

The paper 810 (or other media) is held as a stack of sheets in a cassette 817. A hopping roller 818 feeds the paper 810 one sheet at a time toward a paired registration roller 819a and pinch roller 820a. After passing between these rollers, the paper 810 travels to another registration roller 819b and pinch roller 820b, which feed the paper toward the yellow process unit 811a.

Guided by a paper guide 821, the paper 810 passes through the process units 811a, 811b, 811c, 811d in turn, traveling in each process unit between the photosensitive drum 812 and a transfer roller 822 made of, for example, semi-conductive rubber. The transfer roller 822 is charged so as to create a potential difference between the photosensitive drum 812 and the transfer roller 822. The potential difference attracts the toner image from the photosensitive drum 812 onto the paper 810. A full-color image is built up on the paper 810 in four stages, the yellow process unit 811a using yellow toner to print a yellow image, the magenta process unit 811b using magenta toner to print a magenta image, the cyan process unit 811c using cyan toner to print a cyan image, the black process unit 811d using black toner to print a black image.

From the black process unit 811d, the paper 810 travels through a fuser 823, in which a heat roller and back-up roller apply heat and pressure to fuse the transferred toner image onto the paper. A first delivery roller 824a and pinch roller 825a then feed the paper 810 upward to a second delivery roller 824b and pinch roller 825b, which deliver the printed paper onto a stacker 826 at the top of the printer.

The photosensitive drum 812 and various of the rollers are driven by motors and gears not shown in the drawing. The motors are controlled by a control unit (not shown) that, for example, drives registration roller 819a and halts registration roller 819b until the front edge of a sheet of paper 810 rests flush against registration roller 819b, then drives registration roller 819b, thereby assuring that the paper 810 is correctly aligned during its travel through the process units 811a, 811b, 811c, 811d. The registration rollers 819a, 819b, delivery rollers 824a, 824b, and pinch rollers 820a, 820b, 825a, 825b also have the function of changing the direction of travel of the paper 810.

The LED heads 814 account for a significant part of the manufacturing cost of this type of LED printer 800, and the density of the light-emitting elements in their LED arrays is a significant factor in the quality of the printed image. By enabling high-density LED arrays to be manufactured without the need for expensive, high-density wire bonding, the present invention enables high-quality printing to be obtained at a reasonable cost.

Next, a few variations of the preceding embodiments will be noted.

Figure 17:
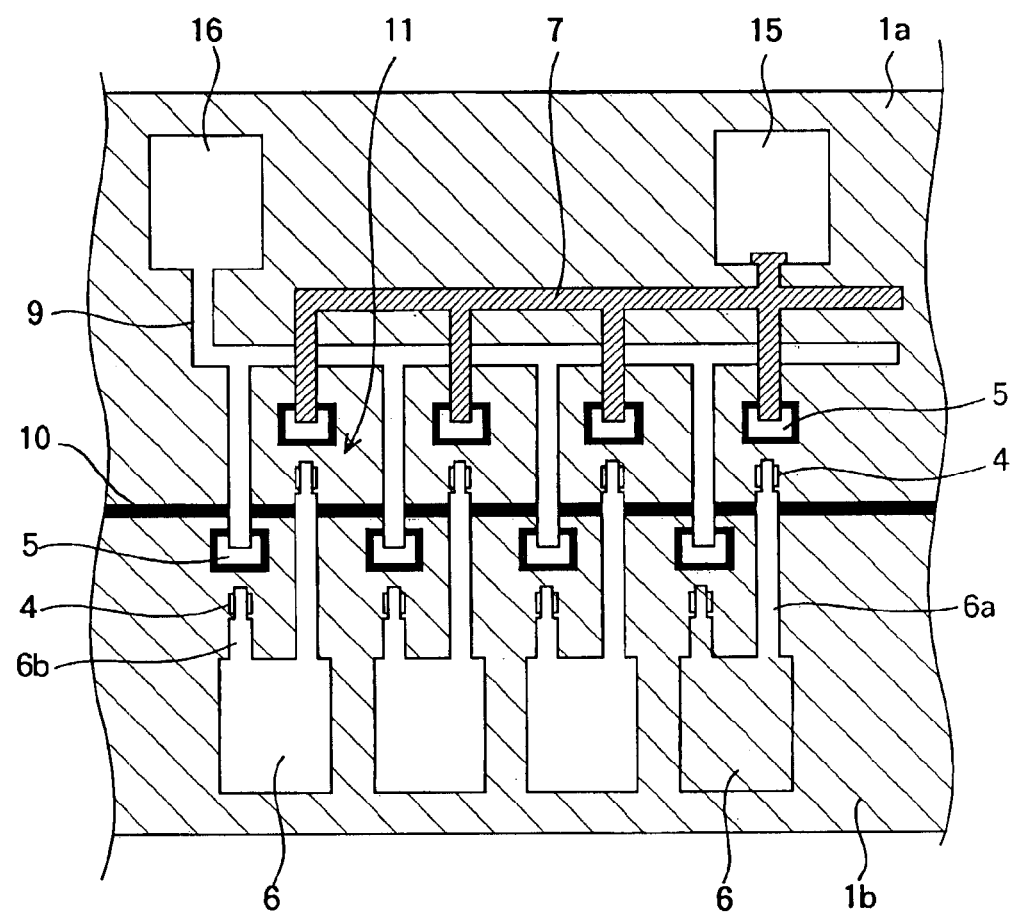
FIG. 17 is a plan view of part of an LED array illustrating a variation of the first embodiment.
Figure 18:
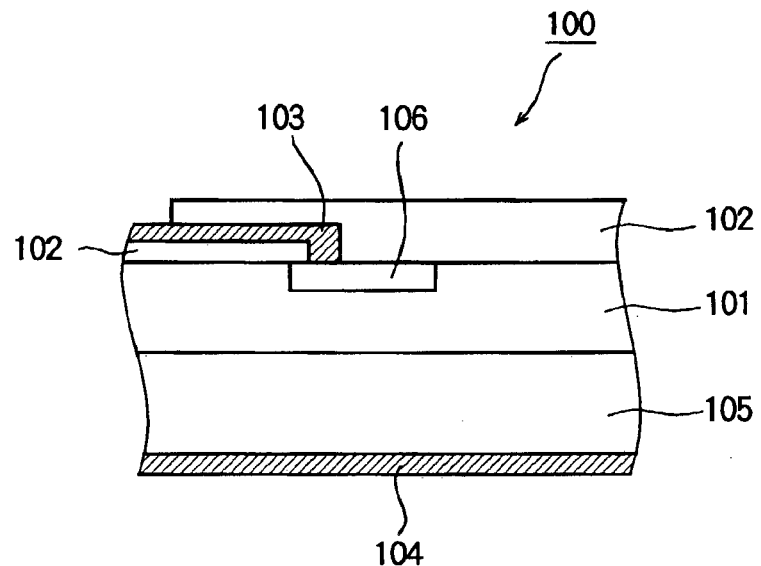
FIG. 18 is a sectional view of part of a conventional LED array.
Figure 19:
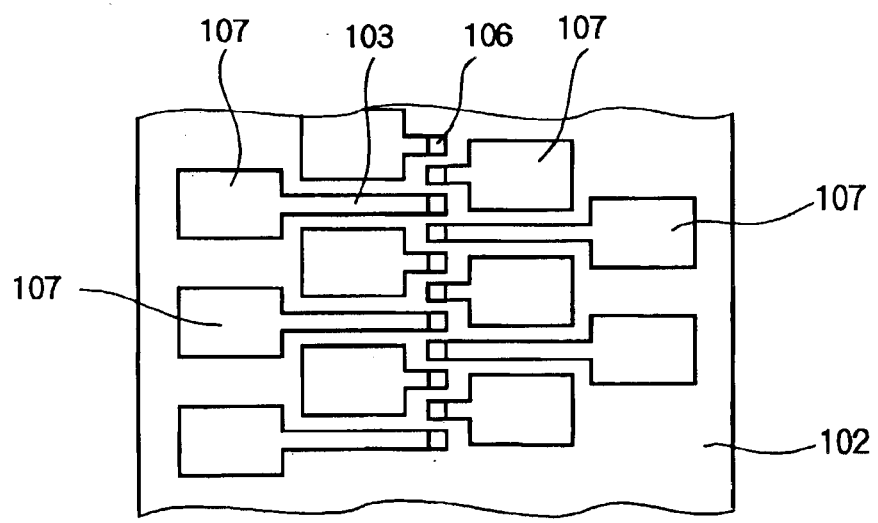
FIG. 19 is a plan view of part of the conventional LED array.

In the first embodiment, instead of a linear array of light-emitting elements being divided into segments by an isolation trench with a square-wave configuration, the isolation trench 10 may be linear and the light-emitting elements 11 may be disposed in a staggered array alternately above and below the isolation trench 10, as illustrated in FIG. 17. In this variation, since the two semiconductor blocks 1a, 1b do not have comb-tooth-like projections, the isolation trench 10 is shortened, with the advantage of improved manufacturing yields, as noted in the fourth embodiment. The time interval between the driving of the light-emitting elements disposed in semiconductor block 1a and the driving of the light-emitting elements disposed in semiconductor block 1b can be adjusted according to the rotational speed of a photosensitive drum in an electrophotographic printer, so that both groups of light-emitting elements illuminate a single line of dots on the surface of the photosensitive drum as the photosensitive drum turns at a constant speed.

The arrays of light-emitting elements in the other embodiments may also be staggered instead of linear.

In the fourth embodiment, instead of having a square-wave configuration as in the first embodiment, the isolation trench may form closed loops as in the second or third embodiment, each closed loop surrounding a pair of light-emitting elements.

In the fifth embodiment, instead of having the configuration shown in the first embodiment, the isolation trench may have the configuration shown in the second, third, or fourth embodiment, or the configuration in the above variation of the first or fourth embodiment.

The light-emitting elements shown in the sixth embodiment were described as being used in an LED array configured as in the first embodiment, but these light-emitting elements may also be used in an LED array configured as in any of the second to fifth embodiments.

In the embodiments described above, the first conductive type was n-type and the second semiconductor conductive type was p-type, but these conductive types may be interchanged.

Terms such as "left", "above", "underlying" and "overlying" in the descriptions of the embodiments and the appended claims are used for convenience and do not limit the absolute positional relationships of the various parts of the LED arrays.

Those skilled in the art will recognize that further variations are possible within the scope of the invention, which is defined by the appended claims.

What is claimed is:

1. A light-emitting-element array, comprising:
   a current-blocking layer;
   a semiconductor layer of a first conductive type formed on the current-blocking layer, divided by an isolation trench into a first semiconductor region and a remaining semiconductor region, the remaining semiconductor region being electrically isolated from the first semiconductor region;
   a plurality of light-emitting elements formed by diffusion of an impurity of a second conductive type into a surface of the semiconductor layer, the light-emitting elements being disposed in an array divided by the isolation trench into segments including at least one light-emitting element each, the segments being disposed alternately in the first semiconductor region and the remaining semiconductor region;
   a first shared interconnecting pad electrically coupled to the light-emitting elements in the first semiconductor region by electrical paths not crossing the isolation trench; and
   a second shared interconnecting pad electrically coupled to the light-emitting elements in the remaining semiconductor region by electrical paths crossing the isolation trench.

2. The light-emitting-element array according to claim 1, wherein each of the segments of the array of light-emitting elements includes just one light-emitting element.

3. The light-emitting-element array according to claim 1, wherein each of the segments of the array of light-emitting elements includes just two light-emitting elements.

4. The light-emitting-element array according to claim 1, wherein the isolation trench is linear.

5. The light-emitting-element array according to claim 1, wherein the array of light-emitting elements is linear.

6. The light-emitting-element array according to claim 1, wherein the isolation trench has a square-wave configuration weaving through the array of light-emitting elements.

7. The light-emitting-element array according to claim 6, wherein the first and second shared interconnecting pads are disposed in the first semiconductor region, further comprising:
   a number of separate interconnecting pads equal to half the total number of the light-emitting elements in the array, the separate interconnecting pads being disposed in the remaining semiconductor region, each of the separate interconnecting pads being electrically coupled to a mutually adjacent pair of light-emitting elements, the two light-emitting elements constituting the mutually adjacent pair belonging to different segments of the array.

8. The light-emitting-element array according to claim 1, wherein the isolation trench surrounds each of the segments disposed in the remaining semiconductor region, thereby dividing the remaining semiconductor region into mutually isolated subregions.

9. The light-emitting-element array according to claim 8, wherein the isolation trench also isolates the first semiconductor region from a part of the remaining semiconductor region not including any segments of the array of light-emitting elements.

10. The light-emitting-element array according to claim 9, wherein the first and second shared interconnecting pads are disposed in the first semiconductor region, further comprising:
    a number of separate interconnecting pads equal to half the total number of the light-emitting elements in the array, the separate interconnecting pads being disposed in the part of the remaining semiconductor region not including any segments of the array, each of the separate interconnecting pads being electrically coupled to a mutually adjacent pair of light-emitting elements, the two light-emitting elements constituting the mutually adjacent pair belonging to different segments of the array.

11. The light-emitting array according to claim 1, wherein the first conductive type is n-type and the second conductive type is p-type.

12. The light-emitting array according to claim 11, wherein the semiconductor layer comprises:
    an n-type $Al_yGa_{1-y}As$ layer, where $1>y>0$;
    an n-type $Al_zGa_{1-z}As$ layer overlying the n-type $Al_yGa_{1-y}As$ layer, where $1>z>y>0$;
    an n-type $Al_xGa_{1-x}As$ layer underlying the n-type $Al_yGa_{1-y}As$ layer, where $1>x>y>0$; and
    an n-type GaAs contact cap layer having an interface with the n-type $Al_zGa_{1-z}As$ layer;
    wherein the light-emitting elements have bottom diffusion fronts and lateral diffusion fronts, the bottom diffusion fronts being located in the n-type $Al_yGa_{1-y}As$ layer, parts of the n-type GaAs contact cap layer including the lateral diffusion fronts being removed to eliminate pn junctions therein.

13. The light-emitting-element array according to claim 12, wherein the impurity of the second conductive type is zinc.

14. An optical printing head comprising at least one light-emitting-element array as recited in claim 1.

15. The optical printing head according to claim 14, further comprising:

a base for supporting the light-emitting-element array;

a rod lens array for focusing the light emitted by the light-emitting elements in the light-emitting-element array;

a holder for holding the rod lens array; and at least one clamp for holding the base and the holder together.

16. An electrophotographic printer comprising at least one optical printing head having at least one light-emitting-element array as recited in claim 1.

17. The electrophotographic printer according to claim 16, further comprising:

a photosensitive drum selectively illuminated by the light-emitting elements in the optical printing head to form a latent electrostatic image;

a developing unit for supplying toner to develop the latent electrostatic image on the photosensitive drum; and a transfer roller for transferring the developed image from the photosensitive drum to printing media.

* * * * *